(12) United States Patent
Kusama et al.

(10) Patent No.: US 10,211,119 B2
(45) Date of Patent: Feb. 19, 2019

(54) ELECTRONIC COMPONENT BUILT-IN SUBSTRATE AND ELECTRONIC DEVICE

(71) Applicant: SHINKO ELECTRIC INDUSTRIES CO., LTD., Nagano-shi, Nagano (JP)

(72) Inventors: Yasuhiko Kusama, Nagano (JP); Hironobu Hashimoto, Nagano (JP); Takeshi Chino, Nagano (JP); Kazuhiro Kobayashi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/163,032

(22) Filed: May 24, 2016

(65) Prior Publication Data

US 2016/0353576 A1 Dec. 1, 2016

(30) Foreign Application Priority Data

May 26, 2015 (JP) .................. 2015-106253

(51) Int. Cl.
*H05K 1/11* (2006.01)
*H05K 3/42* (2006.01)
(Continued)

(52) U.S. Cl.
CPC .... *H01L 23/3142* (2013.01); *H01L 23/49822* (2013.01); *H01L 23/49827* (2013.01);
(Continued)

(58) Field of Classification Search
CPC ...... H05K 1/4697; H05K 1/115; H05K 3/429; H05K 3/4697; H05K 2201/096;
(Continued)

(56) References Cited

U.S. PATENT DOCUMENTS 6,010,769 A * 1/2000 Sasaoka ............ H01L 21/4857
174/262
2006/0054352 A1 3/2006 Ryu et al.
(Continued)

FOREIGN PATENT DOCUMENTS

JP 2006-086488 A 3/2006
JP 2007-123524 5/2007
(Continued)

OTHER PUBLICATIONS

Japanese Office Action with English translation dated Aug. 7, 2018, 4 pages.

*Primary Examiner* — Michael P McFadden
(74) *Attorney, Agent, or Firm* — Rankin, Hill & Clark LLP

(57) ABSTRACT

An electronic component built-in substrate includes an insulating base material having a first surface and a second surface opposite to the first surface, an electronic component embedded in the insulating base material and having an electrode on a side surface thereof, a first wiring layer embedded in an area outside the electrode of the electronic component in the insulating base material with a surface of the first wiring layer being exposed from the first surface of the insulating base material, a via conductor reaching from the second surface of the insulating base material to a side surface of the electrode of the electronic component and the first wiring layer, and a second wiring layer formed on the second surface of the insulating base material and connected to the via conductor.

13 Claims, 28 Drawing Sheets

(51) Int. Cl.
   *H05K 3/46* (2006.01)
   *H01L 23/31* (2006.01)
   *H01L 23/50* (2006.01)
   *H01L 23/498* (2006.01)

(52) U.S. Cl.
   CPC .. *H01L 23/49838* (2013.01); *H01L 23/49816* (2013.01); *H01L 23/50* (2013.01); *H01L 2224/16227* (2013.01); *H01L 2224/73204* (2013.01); *H01L 2924/15311* (2013.01); *H05K 1/115* (2013.01); *H05K 3/429* (2013.01); *H05K 3/4697* (2013.01); *H05K 2201/096* (2013.01); *H05K 2201/10015* (2013.01); *H05K 2201/10378* (2013.01)

(58) Field of Classification Search
   CPC .......... H05K 2201/10015; H05K 2201/10378; H01L 23/3142; H01L 23/49822; H01L 23/49827; H01L 23/49838; H01L 23/49816; H01L 23/50; H01L 2224/16227; H01L 2224/73204; H01L 2924/15311
   USPC ......................................................... 361/761
   See application file for complete search history.

(56) References Cited

U.S. PATENT DOCUMENTS

| | | | | |
|---|---|---|---|---|
| 2007/0158101 | A1* | 7/2007 | Chikagawa | H05K 1/186 174/260 |
| 2007/0195511 | A1* | 8/2007 | Imamura | H05K 1/184 361/761 |
| 2008/0123308 | A1 | 5/2008 | Ryu et al. | |
| 2010/0236698 | A1 | 9/2010 | Sekimoto | |
| 2013/0048361 | A1* | 2/2013 | Yamashita | H01L 23/49822 174/260 |
| 2014/0151104 | A1 | 6/2014 | Chung et al. | |
| 2015/0059170 | A1* | 3/2015 | Narumi | H05K 1/185 29/832 |
| 2015/0163919 | A1* | 6/2015 | Nakagome | H05K 3/4084 174/255 |
| 2015/0382478 | A1* | 12/2015 | Shimada | C23F 1/00 361/761 |
| 2016/0262260 | A1* | 9/2016 | Oyamada | H05K 1/0231 |

FOREIGN PATENT DOCUMENTS

| | | |
|---|---|---|
| JP | 2008-182071 A | 8/2008 |
| JP | 2011-138873 | 7/2011 |
| JP | 2013-51336 | 3/2013 |
| JP | 2014-110423 A | 6/2014 |
| WO | 2009/081853 A1 | 7/2009 |

* cited by examiner (PARTIAL PLAN VIEW)

ELECTRONIC COMPONENT BUILT-IN SUBSTRATE AND ELECTRONIC DEVICE

CROSS-REFERENCE TO RELATED APPLICATION

The present application claims priority from Japanese Patent Application No. 2015-106253 filed on May 26, 2015, the entire content of which is incorporated herein by reference.

BACKGROUND

Technical Field

The present disclosure relates to an electronic component built-in substrate and an electronic device.

Related Art

In the related art, an electronic component built-in substrate where a capacitor element is built in a wiring substrate has been known. The capacitor element is arranged as a decoupling capacitor between a power supply line and a ground line of an LSI so as to stabilize a power supply voltage and to reduce a high-frequency noise.
[Patent Document 1] Japanese Patent Application Publication No. 2007-123524A
[Patent Document 2] Japanese Patent Application Publication No. 2011-138873A
[Patent Document 3] Japanese Patent Application Publication No. 2013-51336A Like an electronic component built-in substrate relating to preliminary matters to be described later, there is a need to connect the power supply lines and the ground lines to electrodes of the capacitor element from both surfaces of the wiring substrate.

In order to satisfy the need, an extra routing of a wiring layer is required below the capacitor element. Therefore, a layout of terminals of a semiconductor chip to be mounted is limited and a degree of design freedom is lowered.

Also, a convex portion is formed by the wiring layer additionally formed below the capacitor element. For this reason, after mounting the semiconductor chip, when filling an underfill resin below the semiconductor chip, a void is likely to be generated, so that the sufficient reliability is not obtained.

SUMMARY

Exemplary embodiments of the invention provide an electronic component built-in substrate and an electronic device which has a novel structure for connecting wiring paths to electrodes of an electronic component from both surfaces of an insulating base material in an electronic component built-in substrate where the electronic component having electrodes on side surfaces thereof is embedded in the insulating base material, and an electronic device.

An electronic component built-in substrate according to an exemplary embodiment, comprises:
an insulating base material having a first surface and a second surface opposite to the first surface;
an electronic component embedded in the insulating base material and having an electrode on a side surface thereof;
a first wiring layer embedded in an area outside the electrode of the electronic component in the insulating base material with a surface of the first wiring layer being exposed from the first surface of the insulating base material;
a via conductor reaching from the second surface of the insulating base material to a side surface of the electrode of the electronic component and the first wiring layer; and
a second wiring layer formed on the second surface of the insulating base material and connected to the via conductor.

A manufacturing method of an electronic component built-in substrate, according to an exemplary embodiment, comprises:
forming a first wiring layer outside a component mounting area on a base layer;
bonding an electronic component to the component mounting area on the base layer via an adhesive resin layer, the electronic component having an electrode on a side surface thereof;
forming an insulation layer so as to embed therein the electronic component and the first wiring layer;
forming a via hole in the insulation layer, the via hole reaching a side surface of the electrode of the electronic component and the first wiring layer;
forming a second wiring layer on the insulation layer through a via conductor formed in the via hole, the second wiring layer being connected to the side surface of the electrode of the electronic component and to the first wiring layer; and
removing the base layer.

A manufacturing method of an electronic component built-in substrate, according to an exemplary embodiment, comprises:
forming a first wiring layer on a base layer having a component mounting area;
forming a first insulation layer on the base layer and the first wiring layer;
forming a second wiring layer on the first insulation layer outside the component mounting area;
forming an opening in the first insulation layer at a part corresponding to the component mounting area;
bonding an electronic component to the opening of the first insulation layer via an adhesive resin layer, the electronic component having an electrode on a side surface thereof;
forming a second insulation layer on the electronic component, the first insulation layer and the second wiring layer;
forming a via hole in the second insulation layer and the first insulation layer, the via hole reaching a side surface of the electrode of the electronic component and the first wiring layer;
forming a third wiring layer on the second insulation layer through a via conductor formed in the via hole, the third wiring layer being connected to the side surface of the electrode of the electronic component and to the first wiring layer; and
removing the base layer.

According to the disclosure to be described later, in the electronic component built-in substrate, the electronic component having the electrode on the side surface is embedded in the insulating base material having the first surface and the second surface. The first wiring layer is embedded with a surface thereof being exposed from the first surface in the insulating base material outside the electrode of the electronic component.

Also, the via conductor reaching from the second surface of the insulating base material to the side surface of the electrode of the electronic component and the first wiring layer is formed, and the second wiring layer connected to the via conductor is formed on the second surface of the insulating base material.

In this way, the respective wiring layers connected to the pads of both surfaces of the electronic component built-in substrate are connected to the side surfaces of the electrode of the electronic component through the via conductors arranged outside the electronic component.

By adopting the above structure, it is not necessary to further make the routing of the wiring layer below the electronic component. Therefore, a layout of terminals of a semiconductor chip to be mounted is not limited, and it is possible to secure a degree of design freedom.

Also, since the first surface the insulating base material having the first wiring layer arranged therein is flat, it is possible to fill an underfill resin with good reliability after the semiconductor chip is flip chip-connected to the first wiring layer.

DETAILED DESCRIPTION

Hereinafter, exemplary embodiments will be described with reference to the accompanying drawings.

Before describing the exemplary embodiments, preliminary matters, which are bases of the disclosure, are first described.

Figure 1:
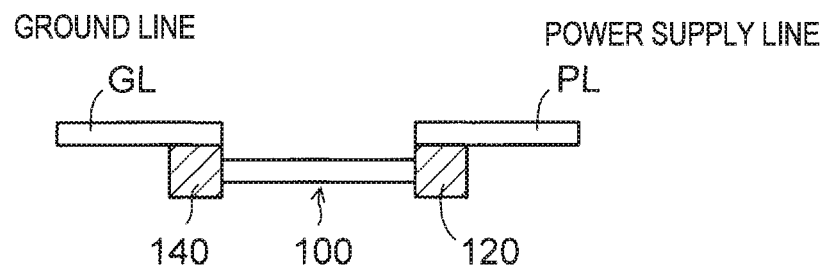
FIG. 1 is a pictorial view depicting an electronic component built-in substrate relating to preliminary matters (1).
Figure 2:
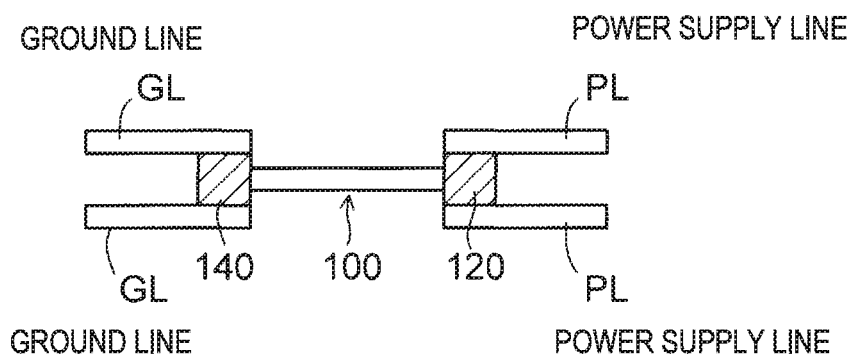
FIG. 2 is a pictorial view depicting an electronic component built-in substrate relating to the preliminary matters (2).
Figure 3:
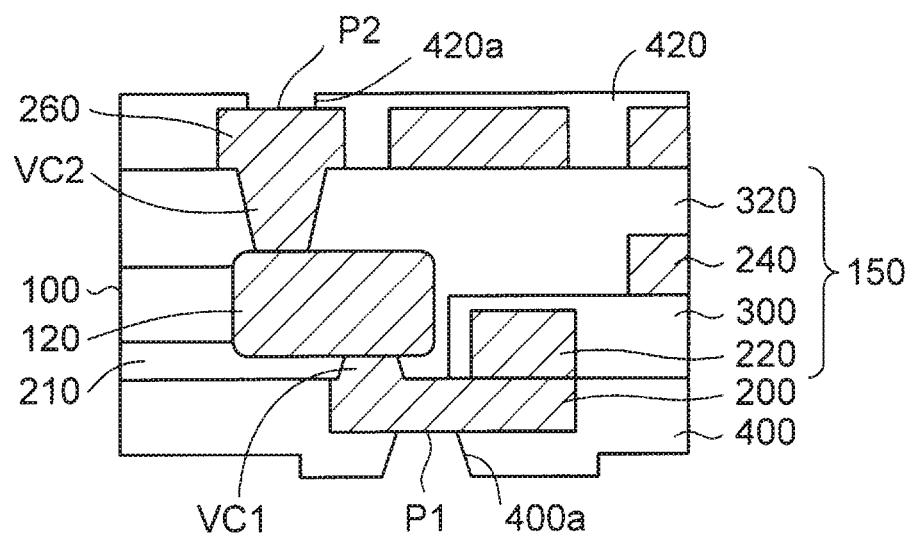
FIG. 3 is a sectional view depicting an electronic component built-in substrate relating to the preliminary matters (3).

FIGS. 1 to 3 depict electronic component built-in substrates in accordance with the preliminary matters. It should be noted that the description of the preliminary matters relates to a personal review of the inventors and is not a known technology.

As shown in a pictorial view of FIG. 1, an electronic component built-in substrate has a capacitor element 100 embedded in a wiring substrate. The capacitor element 100 has electrodes 120, 140 provided at both ends thereof. A power supply line PL is connected to an upper surface of one electrode 120 and a ground line GL is connected to an upper surface of the other electrode 140, so that the capacitor element 100 functions as a decoupling capacitor.

In FIG. 1, the power supply line PL and the ground line GL are respectively connected to pads (not shown) of the wiring substrate.

Like this, the electronic component built-in substrate shown in FIG. 1 has a structure where the power supply line PL and the ground line GL are connected to the one surfaces of the electrodes 120, 140 of the capacitor element 100.

In contrast, as shown in a pictorial view of FIG. 2, there is a need to connect the power supply lines PL and the ground lines GL to the electrodes 120, 140 of the capacitor element 100 from both surfaces of the wiring substrate.

In FIG. 2, the power supply line PL and the ground line GL connected to the upper surfaces of the electrodes 120, 140 of the capacitor element 100 are respectively connected to the respective pads (not shown) at an upper side of the wiring substrate.

Also, the power supply line PL and the ground line GL connected to lower surfaces of the electrodes 120, 140 of the capacitor element 100 are respectively connected to the respective pads (not shown) at a lower side of the wiring substrate.

FIG. 3 depicts a specific structure of an electronic component built-in substrate where power supply lines and ground lines are connected to electrodes of a capacitor element from both surfaces of a wiring substrate. FIG. 3 corresponds to an area in which the power supply lines PL are connected to both surfaces of the right electrode 120 of the capacitor element 100 in the pictorial view of FIG. 2, and the area is partially shown.

As shown in FIG. 3, in the electronic component built-in substrate, the capacitor element 100 is embedded in an insulating base material 150 including an adhesive resin layer 210, a first insulation layer 300 and a second insulation layer 320. The capacitor element 100 has a pair of electrodes at both ends thereof. In FIG. 3, the right electrode 120 of the capacitor element 100 is shown.

A lower surface of the right electrode 120 of the capacitor element 100 is connected to a first wiring layer 200 arranged below the adhesive resin layer 210 through a first via conductor VC1 formed in the adhesive resin layer 210.

Below the adhesive resin layer 210, a first solder resist layer 400 is formed, and a pad P1 of the first wiring layer 200 is exposed through an opening 400a of the first solder resist layer 400.

A second wiring layer 220 directly connected to the first wiring layer 200 is formed on the first solder resist layer 400 and the first wiring layer 200. The second wiring layer 220 is embedded in the first insulation layer 300.

A third wiring layer 240 is formed on the first insulation layer 300. The third wiring layer 240 is embedded in the second insulation layer 320.

Further, a fourth wiring layer 260, which is connected to an upper surface of the electrode 120 of the capacitor element 100 through a second via conductor VC2 formed in the second insulation layer 320, is formed on the second insulation layer 320. A second solder resist layer 420 having an opening 420a arranged on a pad P2 of the fourth wiring layer 260 is formed on the second insulation layer 320.

Thereby, the pad P1 of the first wiring layer 200 of the lower side is connected to a lower surface of the electrode 120 of the capacitor element 100 through the first via conductor VC1. Also, the pad P2 of the fourth wiring layer 260 of the upper side is connected to the upper surface of the electrode 120 of the capacitor element 100 through the second via conductor VC2.

In this way, it is possible to connect the power supply lines to both surfaces of the right electrode 120 of the capacitor element 100. Likewise, it is possible to connect the ground lines to both surfaces of the left electrode (not shown) of the capacitor element 100.

A semiconductor chip is flip chip-connected to the pad P1 of the first wiring layer 200 at the lower surface-side of the electronic component built-in substrate shown in FIG. 3. Also, the pad P2 of the fourth wiring layer 260 at the upper surface-side of the electronic component built-in substrate shown in FIG. 3 is connected to a mounting substrate such as a motherboard.

In the structure of FIG. 3, in order to connect the power supply lines to the electrode 120 of the capacitor element 100 from both surfaces of the wiring substrate, the power supply lines are connected to not only the upper surface of the electrode 120 of the capacitor element 100 but also the lower surface thereof.

For this reason, as compared to a structure where the power supply line is connected to only the upper surface of the electrode 120 of the capacitor element 100, it is necessary to further form the first via conductor VC1 and the first wiring layer 200 to be connected thereto below the electrode 120 of the capacitor element 100.

For this reason, an extra routing of the wiring layer should be made and arrangement of the pads is limited. As a result, a layout of terminals of the semiconductor chip is limited and a degree of design freedom is lowered.

Also, the first wiring layer 200 that is to be further formed protrudes downwards from lower surfaces of the adhesive resin layer 210 and the first insulation layer 300. For this reason, as compared to the structure where the power supply line is connected to only the upper surface of the electrode 120 of the capacitor element 100, a convex portion is formed on a surface on which the semiconductor chip is mounted.

Therefore, after mounting the semiconductor chip, when filling an underfill resin below the chip, wet-spreading of the underfill resin is deteriorated due to an influence of the convex portion. As a result, a void is likely to be generated in the underfill resin and the sufficient reliability is not obtained.

An electronic component built-in substrate in accordance with exemplary embodiments to be described later can solve the above problems.

First Exemplary Embodiment

Figure 9A:
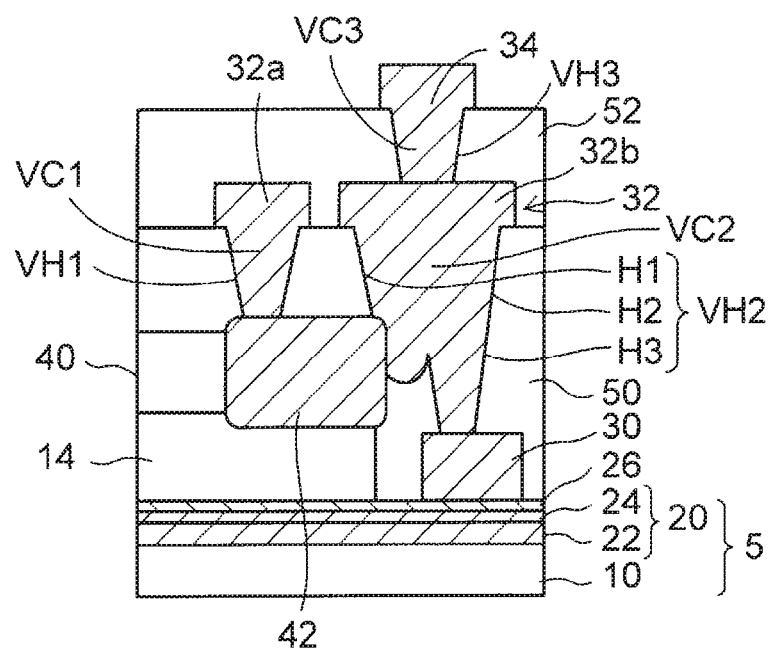
FIGS. 9A and 9B are sectional views depicting the manufacturing method of the electronic component built-in substrate according to the first exemplary embodiment (6).
Figure 9B:
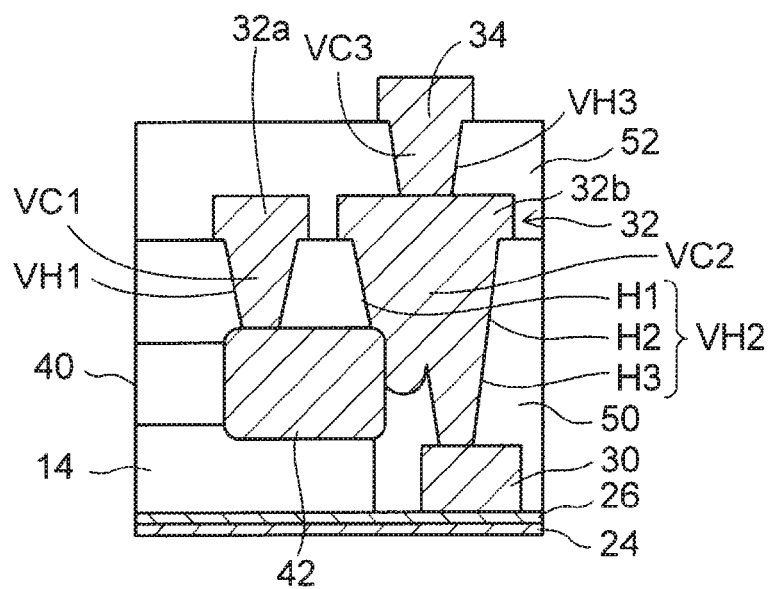
Figure 10A:
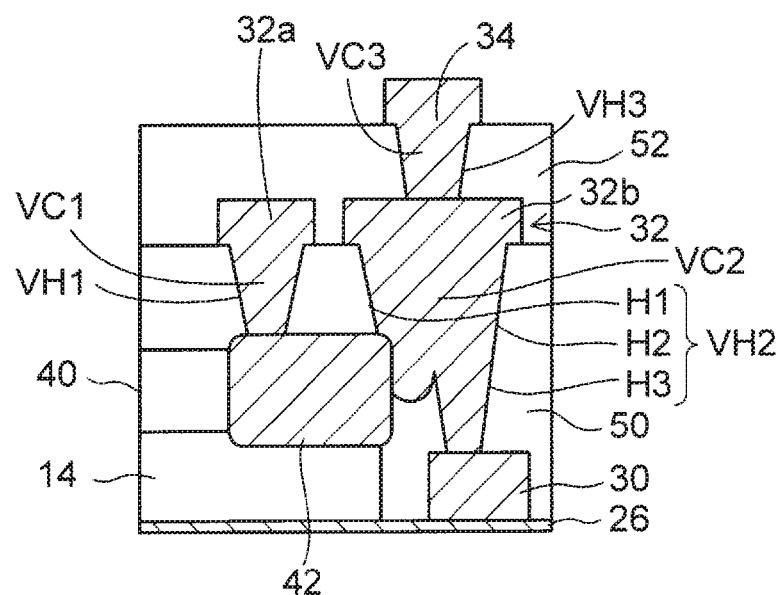
FIGS. 10A and 10B are sectional views depicting the manufacturing method of the electronic component built-in substrate according to the first exemplary embodiment (7).
Figure 10B:
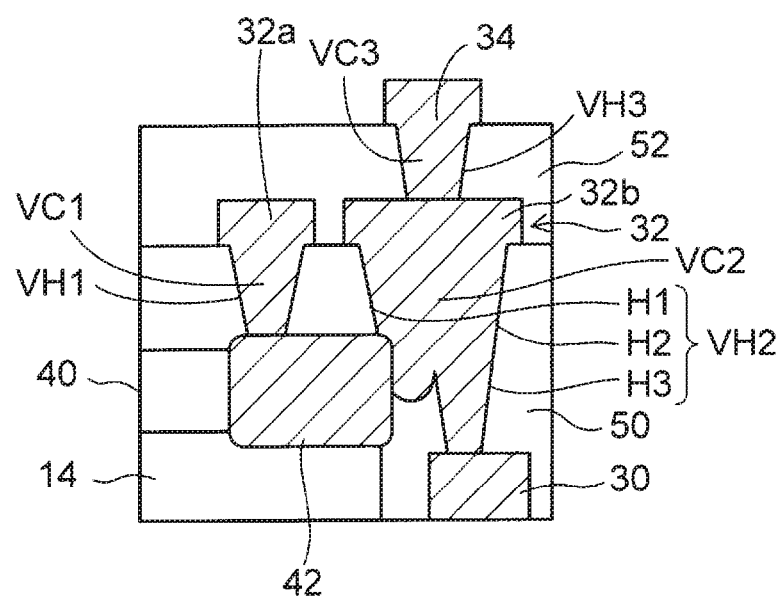
Figure 11:
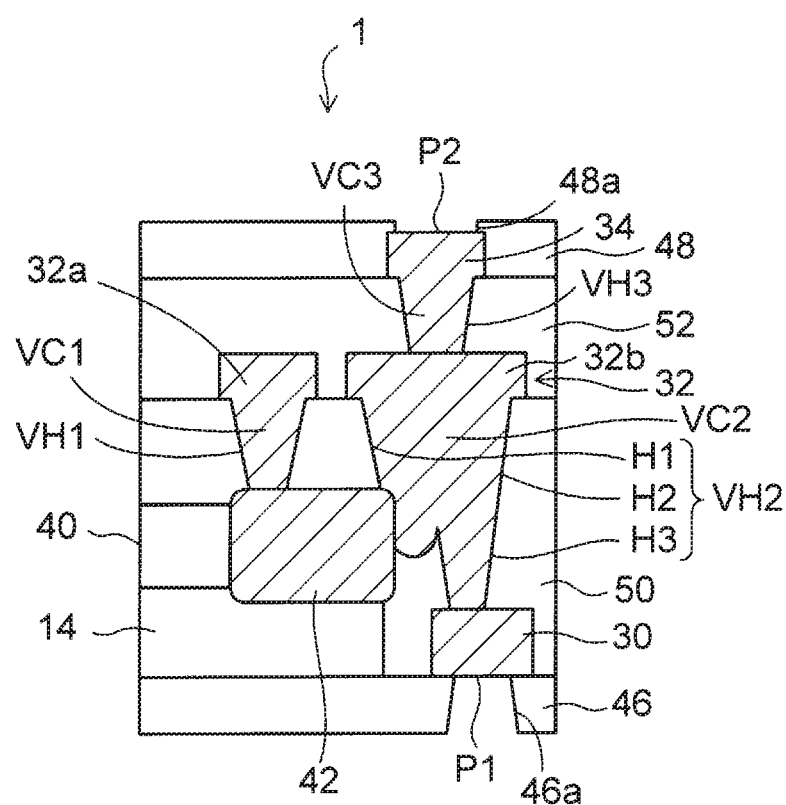
FIG. 11 is a sectional view depicting the electronic component built-in substrate according to the first exemplary embodiment (1).
Figure 12:
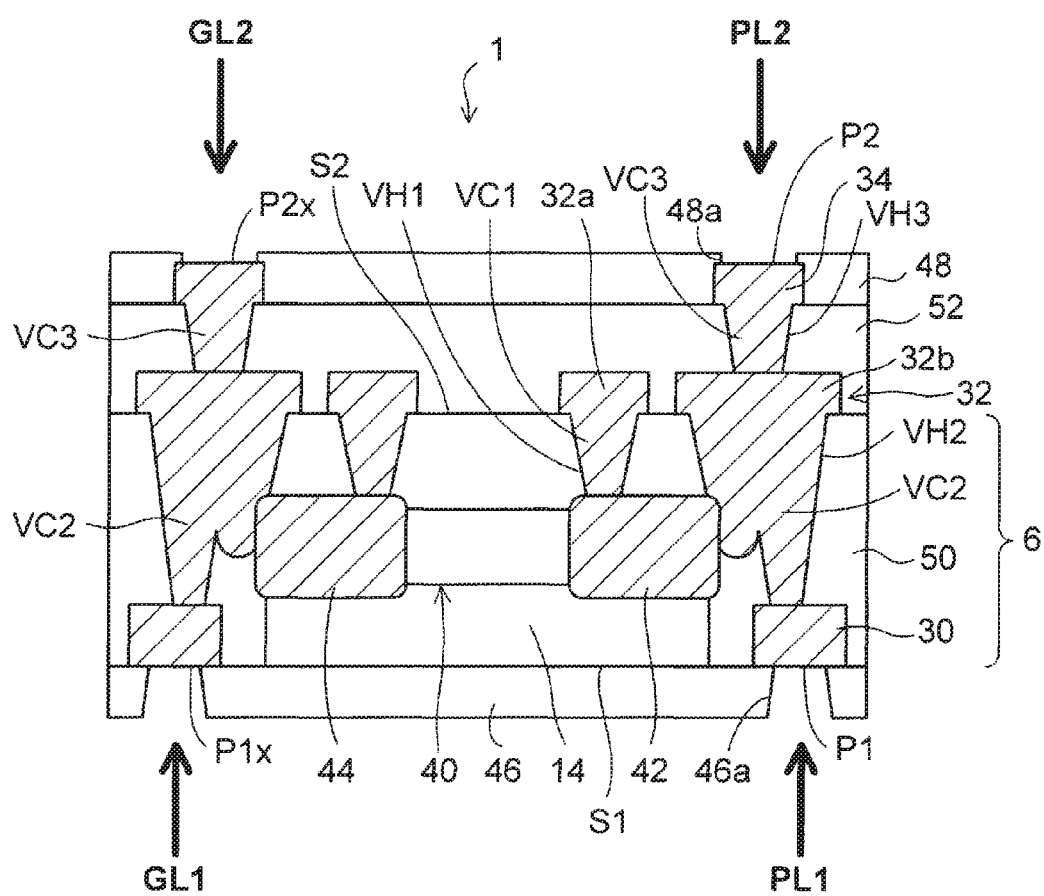
FIG. 12 is a sectional view depicting the electronic component built-in substrate according to the first exemplary embodiment (2).
Figure 13:
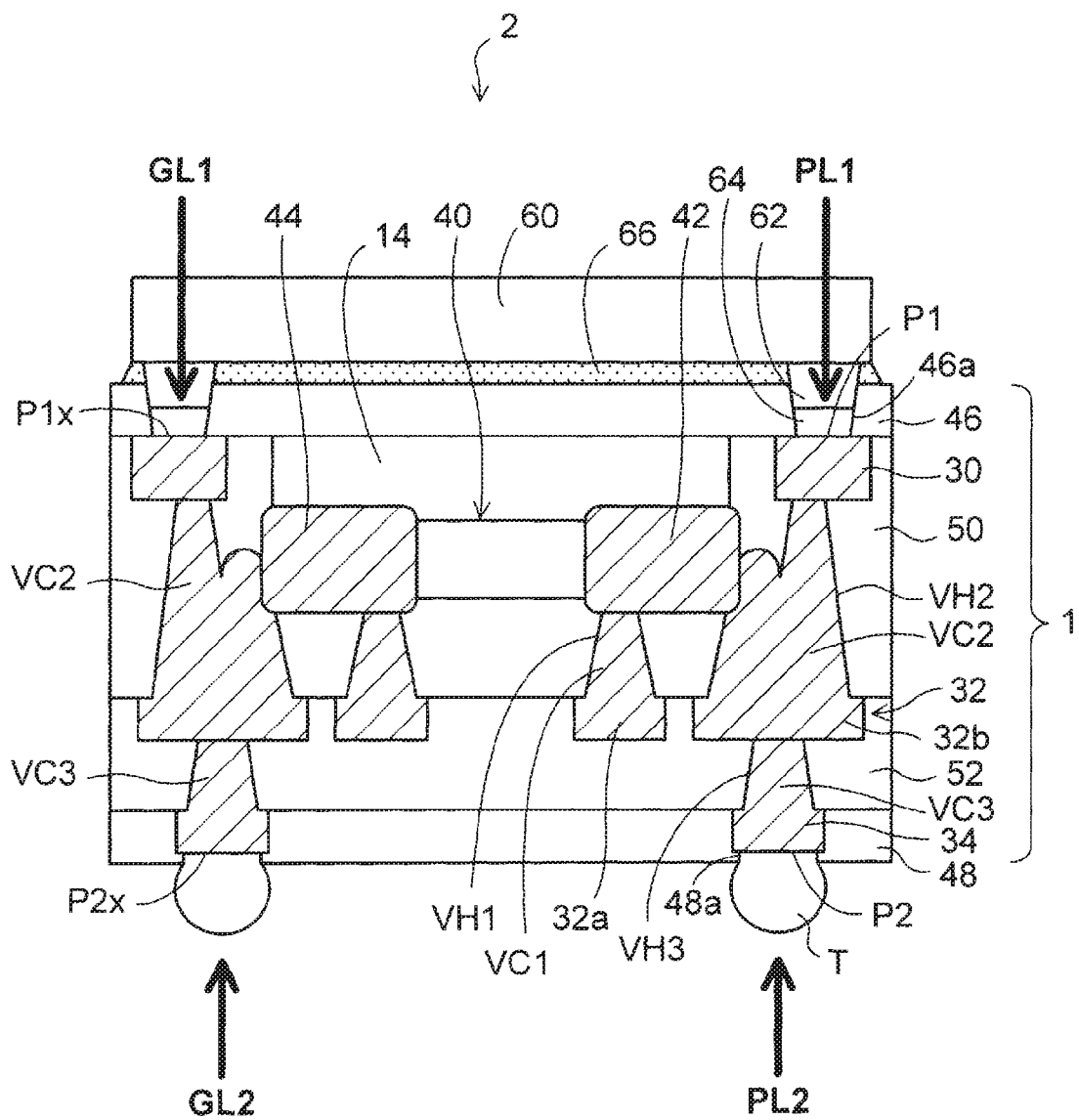
FIG. 13 is a sectional view depicting an electronic device according to the first exemplary embodiment.

FIGS. 4A to 10B depict a manufacturing method of an electronic component built-in substrate in accordance with a first exemplary embodiment, FIGS. 11 and 12 depict the electronic component built-in substrate of the first exemplary embodiment, and FIG. 13 depicts an electronic device of the first exemplary embodiment.

In the below, structures of the electronic component built-in substrate and the electronic device are described while explaining the manufacturing method of the electronic component built-in substrate. FIGS. 4A to 11 relating to the manufacturing method are partial sectional views of the electronic component built-in substrate.

Figure 4A:
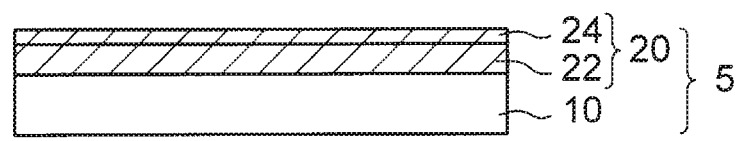
FIGS. 4A to 4D are sectional views depicting a manufacturing method of an electronic component built-in substrate according to a first exemplary embodiment (1).

In the manufacturing method of the electronic component built-in substrate of the first exemplary embodiment, as shown in FIG. 4A, a stacked substrate 5 in which a copper foil 20 having a carrier is bonded on a prepreg 10 is prepared. The prepreg 10 is a composite material in which a resin is impregnated in glass fibers, carbon fibers, aramid fibers or the like.

The copper foil 20 having a carrier includes a carrier copper foil 22 arranged on the prepreg 10-side and a thin film copper foil 24 arranged thereon.

The copper copper foil 22 functions as a carrier for facilitating handling of the thin film copper foil 24.

In the meantime, regarding the carrier copper foil 22 and the thin film copper foil 24, a variety of metal foils such as aluminum foil can be used as substitutes.

A thickness of the prepreg 10 is 50 µm to 500 µm, for example. Also, a thickness of the carrier copper foil 22 is 12 µm to 70 µm, and a thickness of the thin film copper foil 24 is 2 µm to 5 µm.

In the stacked substrate 5, a release agent (not shown) is formed between the carrier copper foil 22 and the thin film copper foil 24, so that the carrier copper foil 22 and the thin film copper foil 24 can be easily peeled off at an interface therebetween. As the release agent, a silicone-based release agent, a fluorine-based release agent or a release agent in which particles including metal components in the components of the release agents are combined, or the like is used.

Figure 4B:
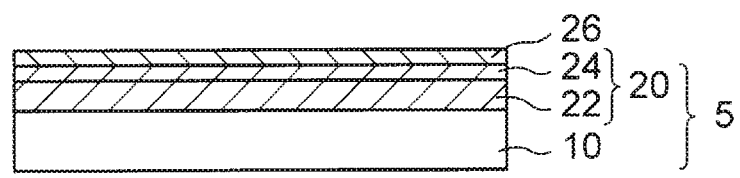

Then, as shown in FIG. 4B, a nickel layer 26 is formed on the thin film copper foil 24 by an electrolytic plating. A thickness of the nickel layer 26 is 2 µm to 5 µm, for example. As described later, the nickel layer 26 functions as an etching stop layer when wet-etching the thin film copper foil 24 after the carrier copper foil 22 is peeled off from the interface with the thin film copper foil 24.

In the first exemplary embodiment, as a base layer for forming the first wiring layer, the stacked substrate 5 having the nickel layer 26 formed thereon is favorably used.

Figure 4C:
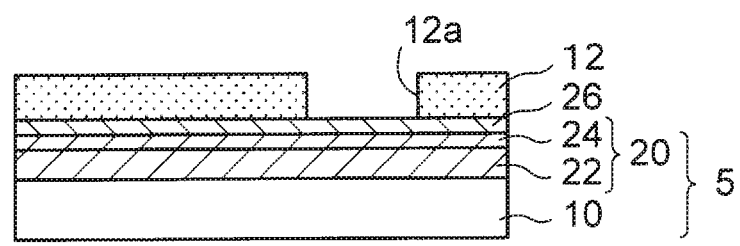

Subsequently, as shown in FIG. 4C, a plating resist layer 12 having openings 12a formed in areas, in which a first wiring layer is to be arranged, is formed on the nickel layer 26.

Figure 4D:
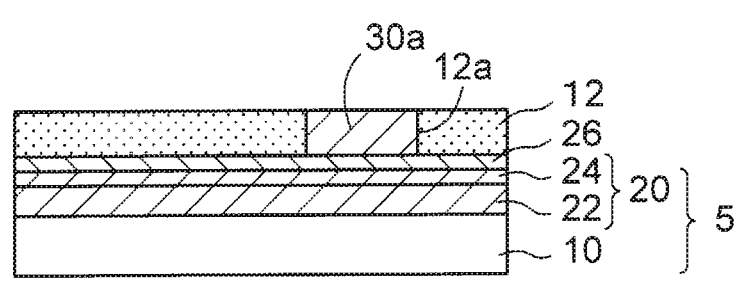

Further, as shown in FIG. 4D, a metal plated layer 30a formed of copper or the like is formed in the openings 12a of the plating resist layer 12 by an electrolytic plating in which the nickel layer 26 is used for a plating power feeding path.

Figure 5A:
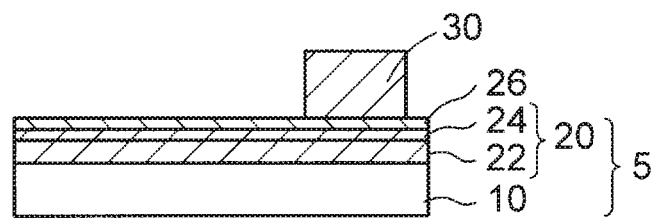
FIGS. 5A to 5C are sectional views depicting the manufacturing method of the electronic component built-in substrate according to the first exemplary embodiment (2).

Subsequently, as shown in FIG. 5A, the plating resist layer 12 is removed. Thereby, a first wiring layer 30 is formed from the metal plated layer 30a.

In the meantime, when forming the wiring layer by a general semi-additive method, a process of etching a seed layer while using the copper plated layer as a mask is used. Since the seed layer has a higher etching rate than the copper plated layer, the seed layer is likely to have an undercut shape in which the seed layer is cut inwardly.

In the first exemplary embodiment, since the first wiring layer 30 is formed of only the metal plated layer 30a and the process of etching the seed layer is not performed, the undercut is not caused at a base part of the first wiring layer 30.

For this reason, even when forming the fine first wiring layer 30 having a line a space (interval) within a range of 2 µm:2 µm to 10 µm:10 µm, a pattern missing is not caused, so that it is possible to form the same with good reliability.

As described later, since a semiconductor chip is flip chip-connected to pads of the first wiring layer 30, it is possible to establish a wiring substrate of a high-performance semiconductor chip. The first wiring layer 30 may be pads arranged in an island shape or a lead-out wiring having pads.

By the above method, the first wiring layer 30 is formed outside a component mounting area on the base layer.

Figure 5B:
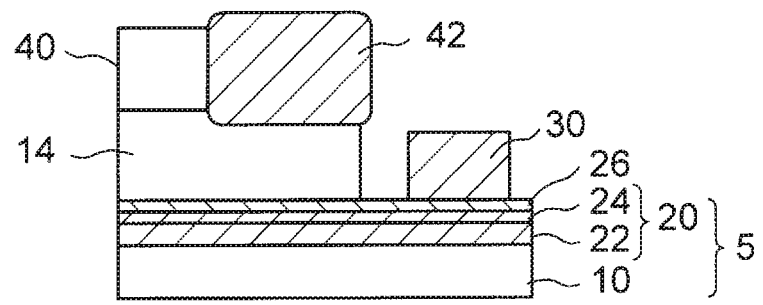

Then, as shown in FIG. 5B, a capacitor element 40 having electrodes on both side surfaces is prepared as an electronic component having electrodes on both side surfaces. Then, the capacitor element 40 is bonded on the nickel layer 26 via an adhesive resin layer 14. As the adhesive resin layer 14, an epoxy resin-based adhesive is used.

The capacitor element 40 has a pair of electrodes on both side surfaces. In FIG. 5B, however, only a right electrode 42 of the capacitor element 40 is partially shown. The electrodes on both ends of the capacitor element 40 have connection surfaces arranged on upper surfaces, side surfaces and lower surfaces of both end portions, respectively.

As the capacitor element 40, a ceramic chip capacitor having electrodes provided at both end portions in a longitudinal direction of a cuboid capacitor main body is used, for example.

In this way, the capacitor element 40 is bonded to the component mounting area on the base layer via the adhesive resin layer 14.

Figure 5C:
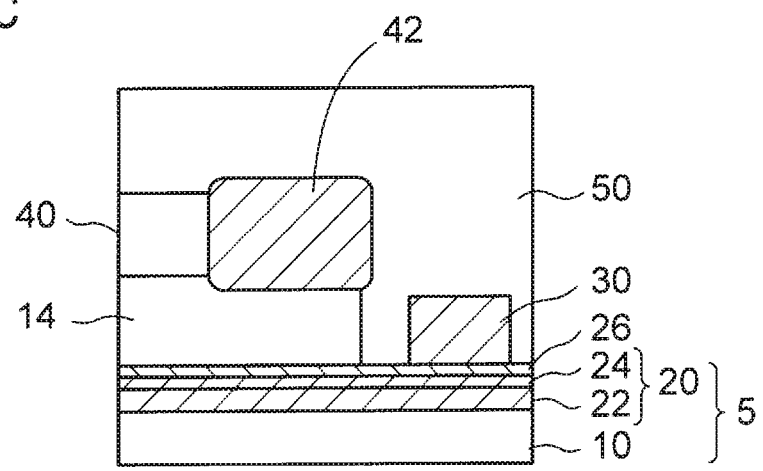

Subsequently, as shown in FIG. 5C, a non-cured resin film is bonded on the nickel layer 26, the first wiring layer 30 and the capacitor element 40 and is cured by heating, so that a first insulation layer 50 is formed. As the resin film, an epoxy resin, an acryl resin, a polyimide resin or the like is used. Alternatively, the first insulation layer 50 may be formed by applying liquid resin.

In this way, the first insulation layer 50 for embedding therein the capacitor element 40 and the first wiring layer 30 is formed.

Figure 6A:
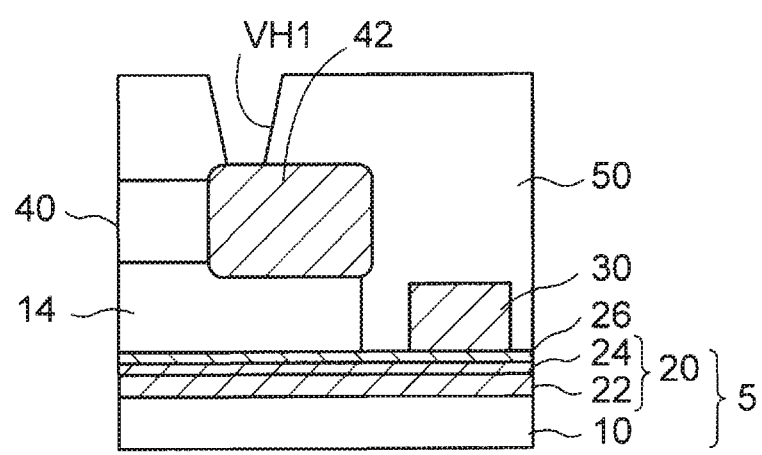
FIGS. 6A and 6B are sectional views depicting the manufacturing method of the electronic component built-in substrate according to the first exemplary embodiment (3).

Then, as shown in FIG. 6A, the first insulation layer 50 is subjected to laser processing, so that a first via hole VH1 reaching an upper surface of the electrode 42 of the capacitor element 40 is formed.

Figure 6B:
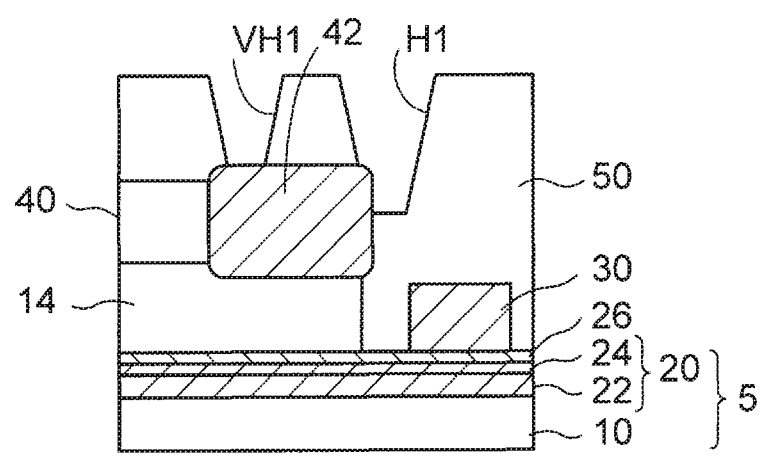

Subsequently, a method of forming second via holes in the first insulation layer 50 is described. The second via hole is formed by performing the laser processing three times. Specifically, as shown in FIG. 6B, the first insulation layer 50 is subjected to first-lime laser processing, so that a first hole H1 reaching a side surface of the electrode 42 of the capacitor element 40 is formed.

Figure 7A:
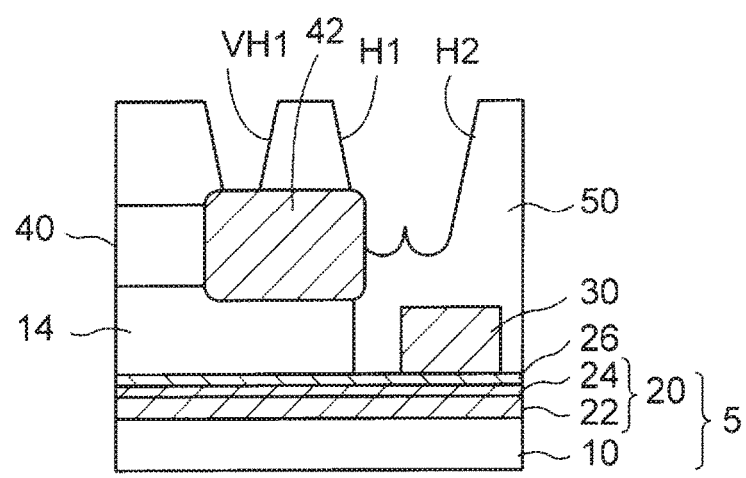
FIGS. 7A and 7B are sectional views and a plan view depicting the manufacturing method of the electronic component built-in substrate according to the first exemplary embodiment (4).

Then, as shown in FIG. 7A, an outer region of the first hole H1 of the first insulation layer 50 is subjected to second-time laser processing, so that a second hole H2 communicating with the first hole H1 is formed.

Figure 7B:
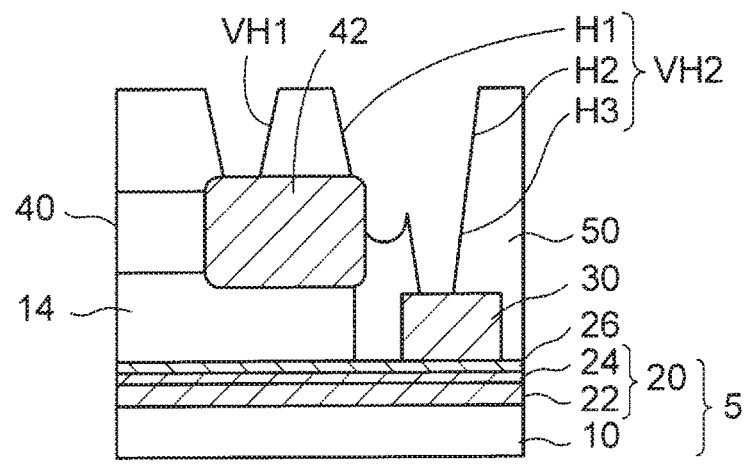
Figure 7B:
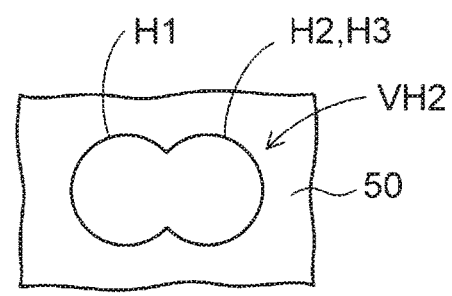

Subsequently, as shown in FIG. 7B, a bottom of the second hole H2 of the first insulation layer 50 is subjected to third-time laser processing, so that a third hole H3 reaching the first wiring layer 30 is formed.

In this way, the first insulation layer 50 is subjected to the laser processing three times, so that a second via hole VH2 is formed by the first hole H1, the second hole H2 and the third hole H3. By the above processes, the side surface of the electrode 42 of the capacitor element 40 and the upper surface of the first wiring layer 30 are exposed into the one second via hole VH2.

In this way, the second via hole VH2 reaching the side surface of the electrode 42 of the capacitor element 40 and the upper surface of the first wiring layer 30 is formed in the first insulation layer 50.

As shown in a partial plan view of FIG. 7B, the second via hole VH2 has a gourd shape having two communicating circles, as seen from a plan view.

Figure 8A:
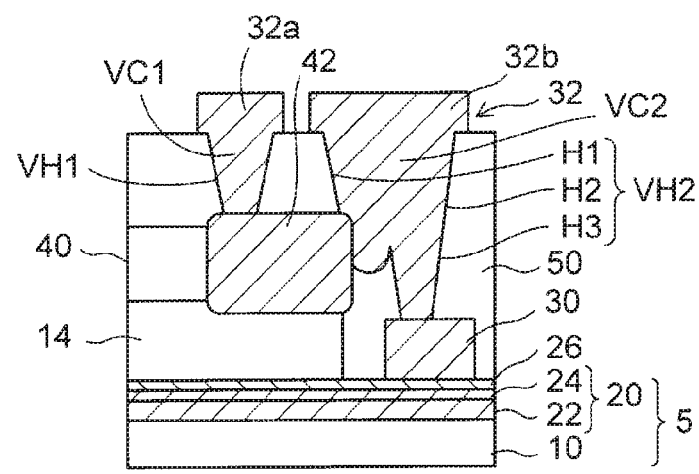
FIGS. 8A to 8C are sectional views depicting the manufacturing method of the electronic component built-in substrate according to the first exemplary embodiment (5).

Then, as shown in FIG. 8A, a second wiring layer 32 is formed in the first via hole VH1, in the second via hole VH2 and on the first insulation layer 50. The second wiring layer 32 is formed to include a first wiring part 32a connected to the upper surface of the electrode 42 of the capacitor element 40 through a first via conductor VC1 in the first via hole VH1.

Also, the second wiring layer 32 is formed to include a second wiring part 32b connected to the side surface of the electrode 42 of the capacitor element 40 and to the upper surface of the first wiring layer 30 through a second via conductor VC2 in the second via hole VH2.

The second wiring layer 32 is formed by a semi-additive method, for example. Specifically, a seed layer (not shown) of copper or the like is formed in the first via hole VH1, in the second via hole VH2 and on the first insulation layer 50 by an electroless plating or a sputtering method.

Then, a plating resist layer (not shown) having openings formed in areas in which the second wiring layer 32 is to be arranged is formed. Subsequently, a metal plated layer (not shown) of copper or the like is formed in the openings of the plating resist layer by an electrolytic plating, in which the seed layer is used for a plating power feeding path, from the first and second via holes VH1, VH2.

Also, after removing the plating resist layer, the seed layer is removed by wet etching while using the metal plated layer as a mask. Thereby, the second wiring layer 32 is formed from the seed layer and the metal plated layer.

Figure 8B:
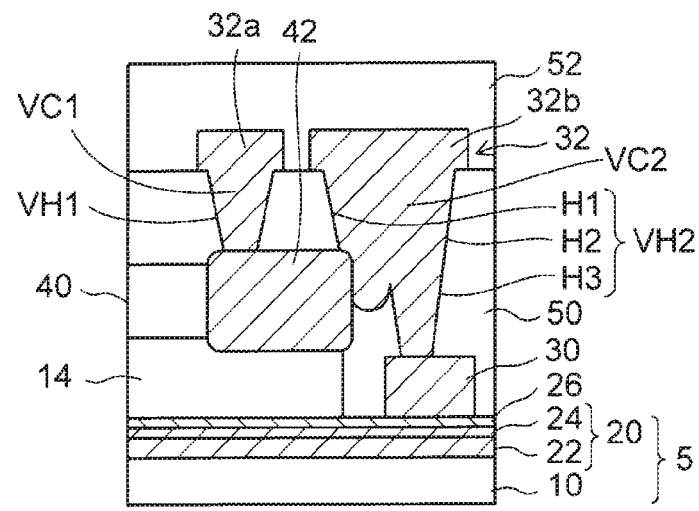

Subsequently, as shown in FIG. 8B, a second insulation layer 52 is formed on the first insulation layer 50 and the second wiring layer 32 by the same method as the formation method of the first insulation layer 50 shown in FIG. 5C.

Figure 8C:
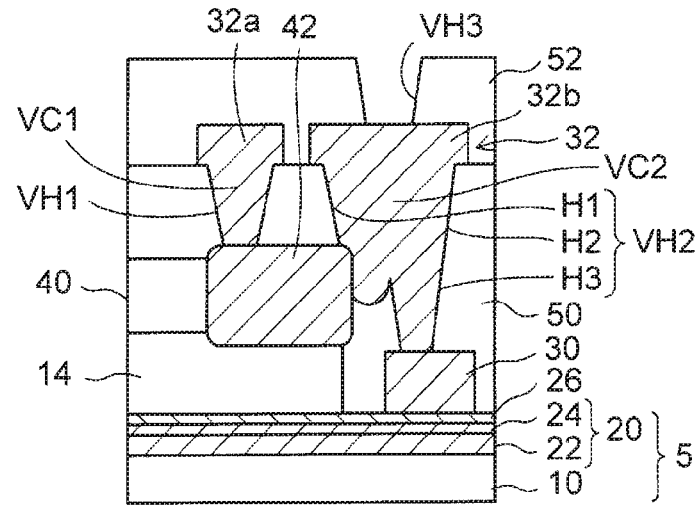

Also, as shown in FIG. 8C, the second insulation layer 52 is subjected to laser processing, so that a third via hole VH3 reaching the second wiring part 32b of the second wiring layer 32 is formed.

Subsequently, as shown in FIG. 9A, a third wiring layer 34 to be connected to the second wiring part 32b of the second wiring layer 32 through a third via conductor VC3 in the third via hole VH3 is formed by the same method as the formation method of the second wiring layer 32 shown in FIG. 8A.

Subsequently, as shown in FIG. 9B, the carrier copper foil 22 and the thin film copper foil 24 of the stacked substrate 5 are peeled off from the interface therebetween, so that the carrier copper foil 22 and the prepreg 10 are separated from the thin film copper foil 24.

Then, as shown in FIG. 10A, the thin film copper foil 24 is wet-etched and removed by a mixed solution of sulfuric acid and hydrogen peroxide solution at a state where the third wiring layer 34 is protected by a protective sheet (not shown) bonded to an upper surface-side of the second insulation layer 52.

At this time, the exposed nickel layer 26 is little etched by the mixed solution of sulfuric acid and hydrogen peroxide solution and functions as an etching stop layer. In this way, the thin film copper foil 24 can be selectively etched with respect to the nickel layer 26.

Subsequently, as shown in FIG. 10B, the nickel layer 26 is wet-etched and removed by nitric acid-based wet etchant. At this time, since the exposed first wiring layer 30 (copper) is little etched by the nitric acid-based wet etchant, the nickel layer 26 can be selectively etched with respect to the first wiring layer 30 and the first insulation layer 50.

Thereby, a lower surface of the first wiring layer 30 is exposed from a lower surface of the first insulation layer 50.

Also, at the same time, lower surfaces of the adhesive resin layer 14 and the first insulation layer 50 are exposed.

In this way, the stacked substrate 5 and the nickel layer 26 thereon formed as the base layer are selectively removed with respect to the first wiring layer 30.

Thereafter, the protective sheet provided on the upper surface-side of the second insulation layer 52 is peeled off and removed.

In the meantime, the nickel layer 26 functioning as an etching stop layer can be omitted. In this case, since the thin film copper foil 24 is directly arranged below the first wiring layer 30 (copper), when removing the thin film copper foil 24, a lower part of the first wiring layer 30 is etched to some extent, so that the first wiring layer 30 is inwardly retreated into the first insulation layer 50.

Subsequently, as shown in FIG. 11, a first solder resist layer 46 having an opening 46a arranged on a pad P1 of the first wiring layer 30 is formed below the first insulation layer 50. Also, a second solder resist layer 48 having an opening 48a arranged on a pad P2 of the third wiring layer 34 is formed on the second insulation layer 52.

The first solder resist layer 46 and the second solder resist layer 48 are formed of epoxy-based or acryl-based insulating resins.

The first solder resist layer 46 and the second solder resist layer 48 are formed by applying photosensitive resins with a roll coat method, exposing, developing and curing the same, for example.

By the above processes, an electronic component built-in substrate 1 of the first exemplary embodiment is obtained.

FIG. 12 depicts an entire shape of the capacitor element 40 of FIG. 11. As shown in FIG. 12, according to the electronic component built-in substrate 1 of the first exemplary embodiment, the capacitor element 40 is entirely embedded in an insulating base material 6. The capacitor element 40 has a pair of electrodes 42, 44 on both side surfaces thereof.

In the first exemplary embodiment, as an electronic component having electrodes on both side surfaces, the capacitor element 40 having the electrodes 42, 44 on both side surfaces is exemplified. In addition, a passive component having electrodes on both side surfaces, such as an inductor element, a resistance element or the like, a semiconductor module component having electrodes on both side surfaces, and the like can also be used.

In the meantime, it is possible to establish the connection structure of the first exemplary embodiment by using an electronic component having an electrode on at least one side surface of both ends.

The insulating base material 6 has a first surface which is a lower surface, and a second surface S2, which is an upper surface opposite to the first surface. In the first exemplary embodiment, the insulating base material 6 is formed by the adhesive resin layer 14 arranged below the capacitor element 40 and the first insulation layer 50 having the capacitor element 40 embedded therein.

The first surface S1 of the insulating base material 6 is the respective lower surfaces of the adhesive resin layer 14 and the first insulation layer 50. Also, the second surface S2 of the insulating base material 6 is the upper surface of the first insulation layer 50.

Also, the first wiring layer 30 is embedded with a surface thereof being exposed from the first surface S1 in the first insulation layer 50 outside the electrodes 42, 44 of the capacitor element 40. The lower surface of the first wiring layer 30 is exposed from the first surface S1 of the first insulation layer 50, and the upper surface and side surfaces of the first wiring layer 30 are embedded in the first insulation layer 50.

The first solder resist layer 46 having the opening 46a arranged on the pad of the first wiring layer 30 is formed on the lower surfaces of the adhesive resin layer 14 and the first insulation layer 50.

The first insulation layer 50 is formed with the first via holes VH1 reaching the upper surfaces of the electrodes 42, 44 of the capacitor element 40.

Also, the first insulation layer 50 is formed with the second via holes VH2 reaching the side surfaces of the electrodes 42, 44 of the capacitor element 40 and the upper surface of the first wiring layer 30.

The second wiring layer 32 is formed to protrude from the second surface S2 of the first insulation layer 50. The second wiring layer 32 has the first wiring parts 32a connected to the upper surfaces of the electrodes 42, 44 of the capacitor element 40 through the first via conductors VC1 in the first via holes VH1.

Also, the second wiring layer 32 has the second wiring parts 32b connected to the side surfaces of the electrodes 42, 44 of the capacitor element 40 and to the upper surface of the first wiring layer 30 through the second via conductors VC2 in the second via holes VH2.

Since the second via conductor VC2 is filled in the second via hole VH2 formed by the three-times laser processing, it has a gourd shape having two communicating circles, as seen from a plan view. Further, since the second via hole is formed from the surface of the first insulation layer 50 by the laser processing, the second via conductor VC2 has a shape, whose area as seen from the plan view decreases with the increasing distance from the surface of the first insulation layer 50.

Also, the second insulation layer 52 is formed on the first insulation layer 50 and the second wiring layer 32. The second insulation layer 52 is formed with the third via holes VH3 on connection parts of the second wiring parts 32b of the second wiring layer 32.

The third wiring layer 34, which is connected to the second wiring parts 32b of the second wiring layer 32 through the third via conductors VC3 in the third via holes VH3, is formed on the second insulation layer 52.

Also, the second solder resist layer 48 having the openings 48a arranged on the pads P2 of the third wiring layer 34 is formed on the second insulation layer 52.

In this way, according to the electronic component built-in substrate 1 of the first exemplary embodiment, the pad P1 of the first wiring layer 30 of the lower surface-side is connected to the side surface of the right electrode 42 of the capacitor element 40 through the second via conductor VC2. This wiring path is a first power supply line PL1.

Also, the pad P2 of the third wiring layer 34 of the upper surface-side of the electronic component built-in substrate 1 is connected to the side surface of the right electrode 42 of the capacitor element 40 through the third via conductor VC3, the second wiring part 32b of the second wiring layer 32 and the second via conductor VC2. This wiring path is a second power supply line PL2.

Further, a pad P1x of the first wiring layer 30 of the electronic component built-in substrate 1 is connected to the side surface of the left electrode 44 of the capacitor element 40 via the second via conductor VC2. This wiring path is a first ground line GL1.

Also, the pad P2x of the third wiring layer 34 of the upper surface-side of the electronic component built-in substrate 1 is connected to the side surface of the left electrode 44 of the capacitor element 40 through the third via conductor VC3, the second wiring part 32b of the second wiring layer 32 and the second via conductor VC1 This wiring path is a second ground line GL2.

In this way, the right electrode 42 of the capacitor element 40 is connected to the first power supply line PL1 of the lower side and the second power supply line PL2 of the upper surface-side.

Likewise, the left electrode 44 of the capacitor element 40 is connected to the first ground line GL1 of the lower side and the second ground line GL2 of the upper surface-side.

In this way, the capacitor element 40 is connected between the first and second power supply lines PL1, PL2 and the first and second ground lines GL1, GL2 and functions as a decoupling capacitor.

The first power supply line PL1 and the first ground line GL1 of the lower side are not formed immediately below the capacitor element 40, and are formed by the second via conductors VC2, which are arranged in areas outside the electrodes 42, 44 of the capacitor element 40 in the first insulation layer 50, and the first wiring layer 30.

The lower surface of the adhesive resin layer 14 below the capacitor element 40, the lower surface of the first wiring layer 30 and the lower surface of the first insulation layer 50 are arranged at the same height, so that the respective lower surfaces are flush with each other.

The reason is that the adhesive resin layer 14, the first wiring layer 30 and the first insulation layer 50 are arranged on the same surface of the base layer and the base layer is finally removed, as described above with respect to the manufacturing method.

As described above, contrary to the manufacturing method of the preliminary matters, according to the first exemplary embodiment, the first power supply line PL1 and the first ground line GL1 of the lower side are formed in the areas outside the capacitor element 40, not in the area immediately below the capacitor element 40.

For this reason, the wiring layer does not protrude from the lower surfaces of the adhesive resin layer 14 and the first insulation layer 50, and the lower surface of the first solder resist layer 46 is formed to be flat as a whole except for the opening 46a.

Also, as described later, the lower surface-side of the electronic component built-in substrate 1 is a component mounting surface, and a semiconductor chip is flip chip-connected to the pads P1, P1x of the first wiring layer 30.

In the first exemplary embodiment, it is possible to freely arrange the pads P1, P1x of the first wiring layer 30 so as to correspond to a layout of terminals of the semiconductor chip. For this reason, the layout of terminals of the semiconductor chip is not limited and it is possible to increase a degree of design freedom.

Also, the second via conductors VC2 configured to connect the first wiring layer 30 and the electrodes 42, 44 of the capacitor element 40 are formed from the metal plated layer by the electrolytic plating. For this reason, as compared to a structure where the electrodes 42, 44 of the capacitor element 40 are connected by applying soldering in via holes of an insulation layer, it is possible to lower a contact resistance and to improve connection reliability.

In the meantime, the capacitor element embedded in the electronic component built-in substrate of the first exemplary embodiment may be used as a coupling capacitor or a bus line capacitor, in addition to the decoupling capacitor.

FIG. 13 depicts an electronic device 2 where a semiconductor chip is mounted on the electronic component built-in substrate 1 of FIG. 12. As shown in FIG. 13, the electronic component built-in substrate 1 of FIG. 12 is inverted up and down. Then, a semiconductor chip 60 having bump-shaped terminals 62 on a lower surface-side is prepared.

Subsequently, the terminals 62 of the semiconductor chip 60 are flip chip-connected to the pads P1, P1x of the first wiring layer 30 of the electronic component built-in substrate 1 via solderings 64.

Also, an underfill resin 66 is filled between the semiconductor chip 60 and the electronic component built-in substrate 1. Since the upper surface of the first solder resist layer 46, which is the component mounting surface, is flat, wet spreading of the underfill resin 66 is favorable. Thereby, a void is not generated in the underfill resin 66 and the high reliability is obtained.

Also, solder balls are mounted to the pads P2, P2x of the third wiring layer 34 of the lower surface-side, so that external connection terminals T are formed. The external connection terminals T are connected to a mounting substrate such as a motherboard. By the above processes, an electronic device 2 of the first exemplary embodiment is obtained.

Figure 14:
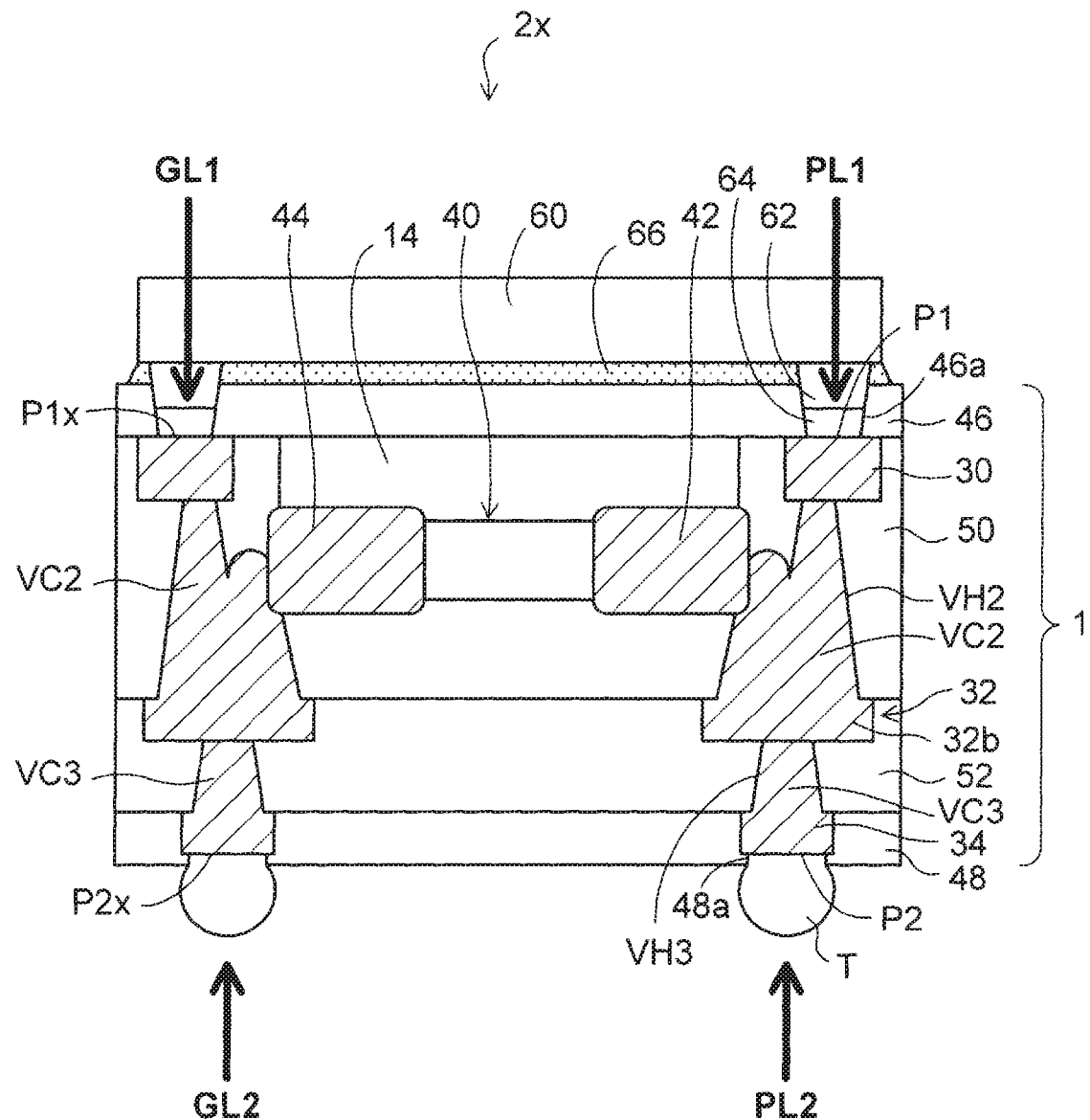
FIG. 14 is a sectional view depicting an electronic device according to a modified example of the first exemplary embodiment.

FIG. 14 depicts an electronic device 2x according to a modified example of the first exemplary embodiment. Like the electronic device 2x of FIG. 14, the first wiring parts 32a of the second wiring layer 32, the first via holes VH1 and the first via conductors VC1 may be omitted from the electronic device 2 of FIG. 13.

Second Exemplary Embodiment

Figure 17A:
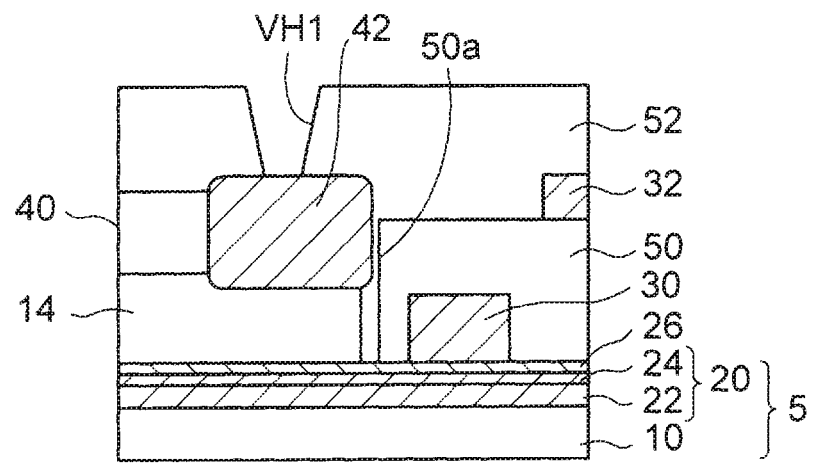
FIGS. 17A and 17B are sectional views depicting the manufacturing method of the electronic component built-in substrate according to the second exemplary embodiment (3).
Figure 17B:
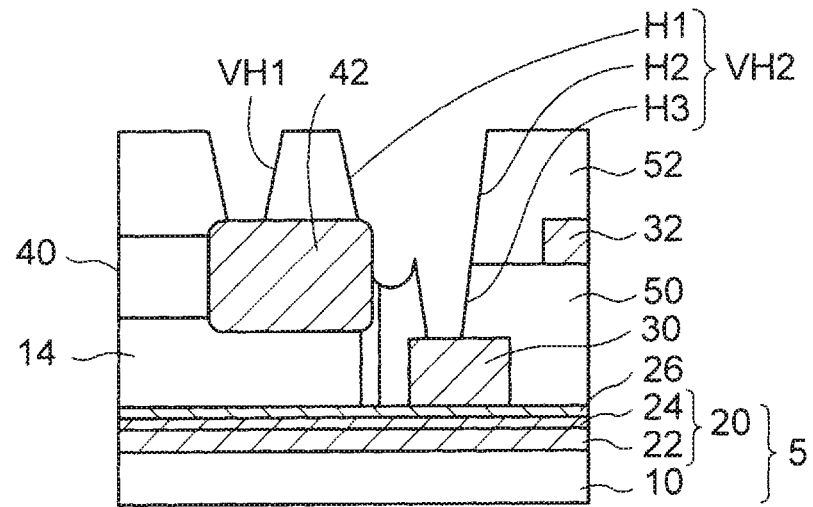
Figure 18A:
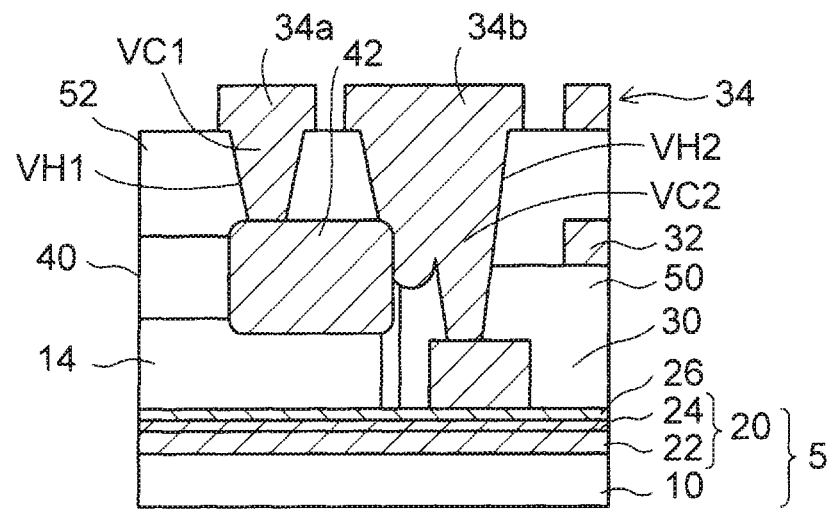
FIGS. 18A and 18B are sectional views depicting the manufacturing method of the electronic component built-in substrate according to the second exemplary embodiment (4).
Figure 18B:
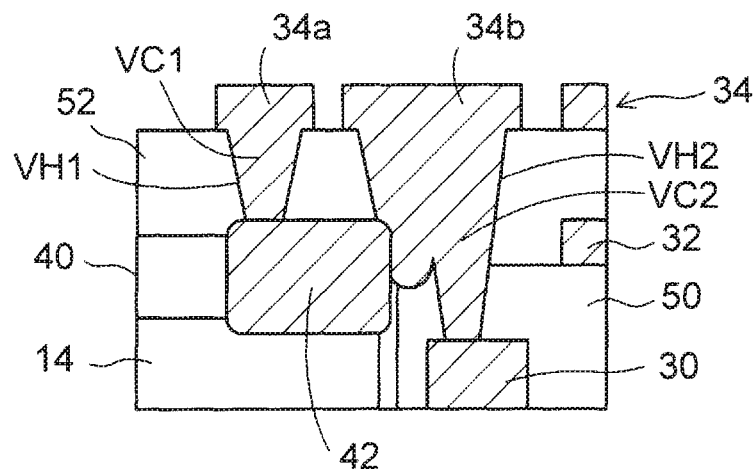
Figure 19:
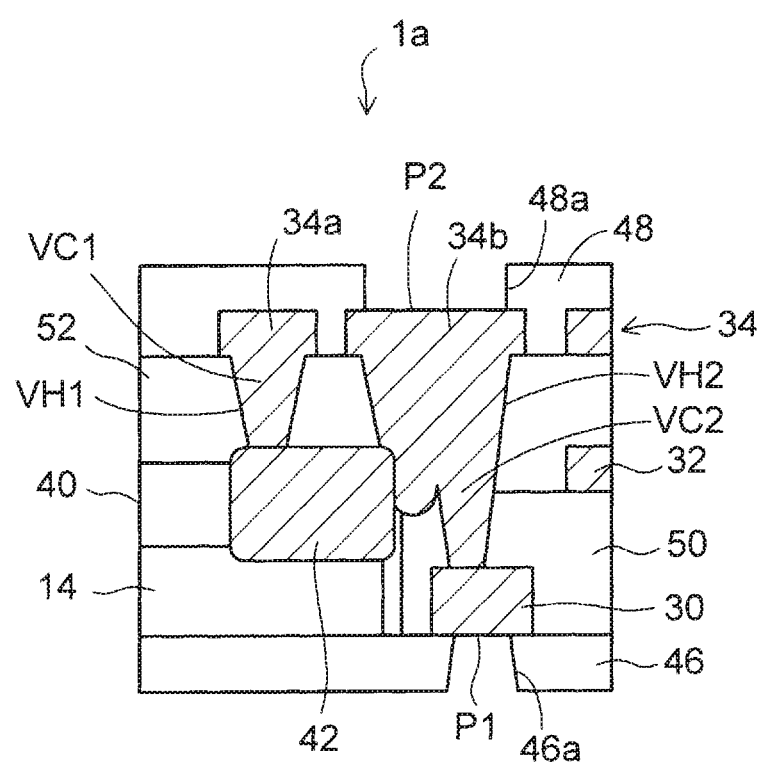
FIG. 19 is a sectional view depicting the electronic component built-in substrate according to the second exemplary embodiment (1).
Figure 20:
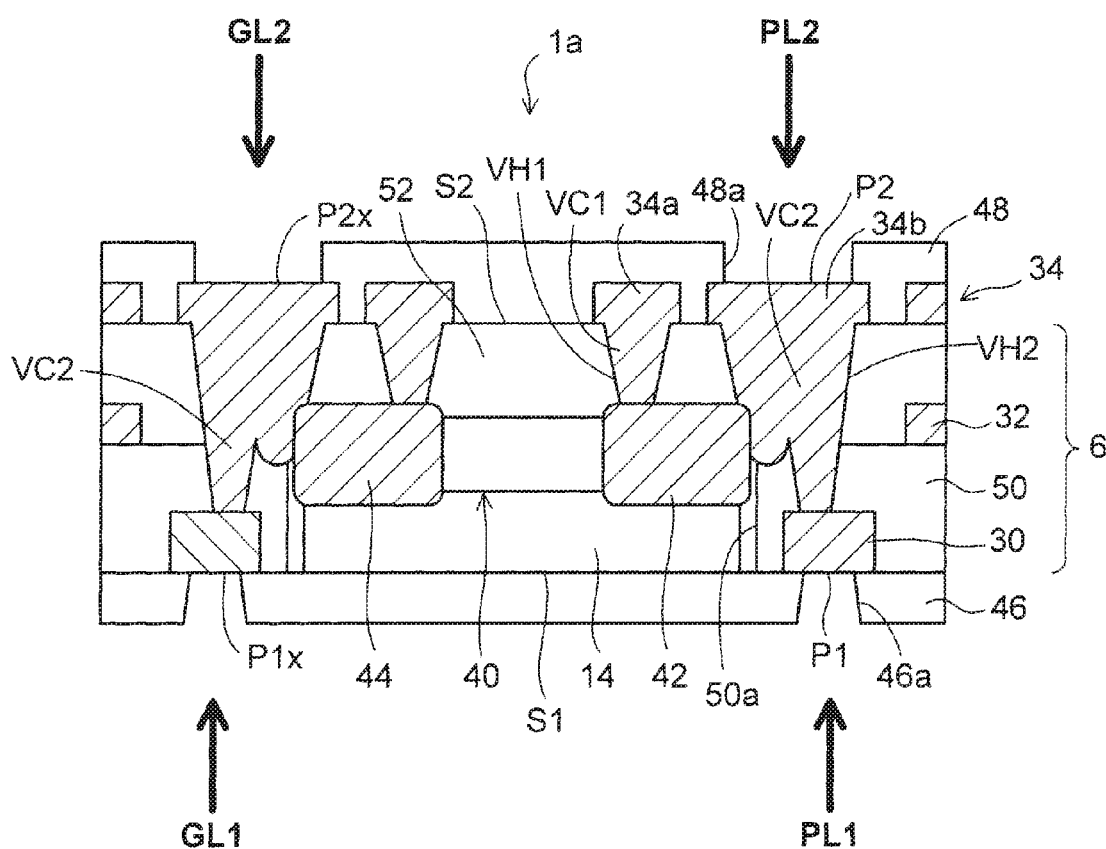
FIG. 20 is a sectional view depicting the electronic component built-in substrate according to the second exemplary embodiment (2).
Figure 21:
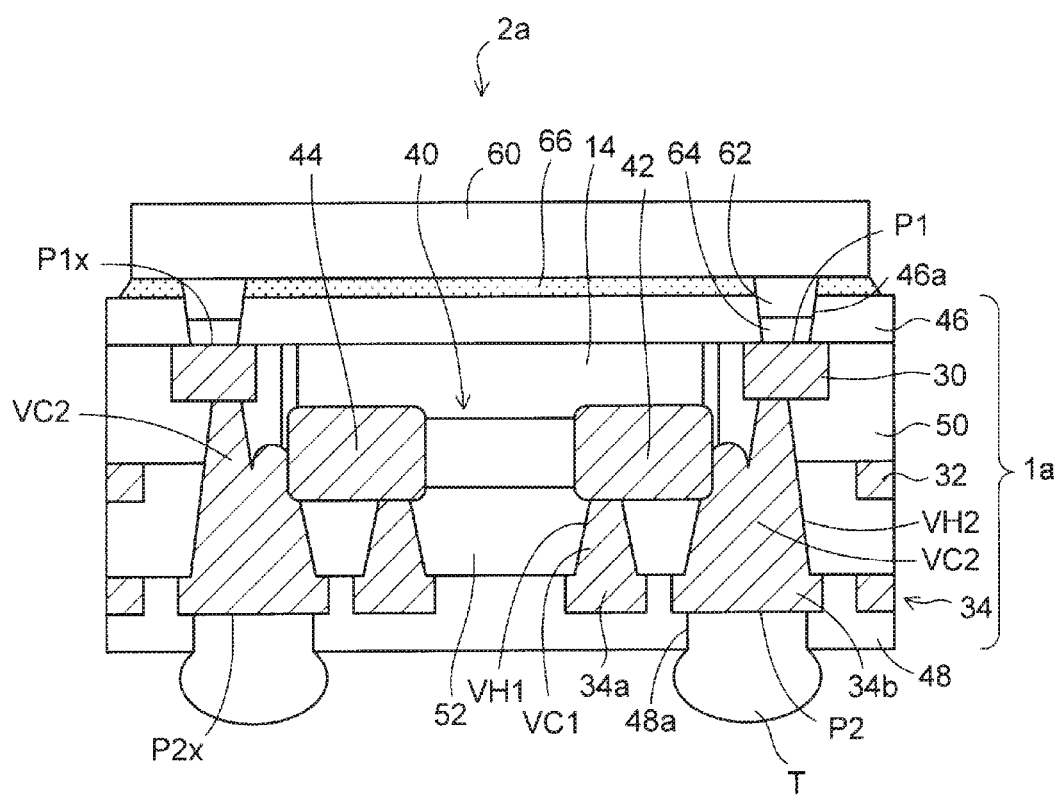
FIG. 21 is a sectional view depicting an electronic device according to the second exemplary embodiment.

FIGS. 15A to 18B depict a manufacturing method of an electronic component built-in substrate in accordance with a second exemplary embodiment, FIGS. 19 and 20 depicts the electronic component built-in substrate of the second exemplary embodiment, and FIG. 21 depicts an electronic device of the second exemplary embodiment.

In the second exemplary embodiment, a substrate is intended to be thin by mounting the capacitor element in the opening of the first insulation layer, embedding the capacitor element with the second insulation layer, and forming the second wiring layer between the first insulation layer and the second insulation layer. Regarding the same elements and processes as the first exemplary embodiment, the detailed descriptions thereof are omitted.

Figure 15A:
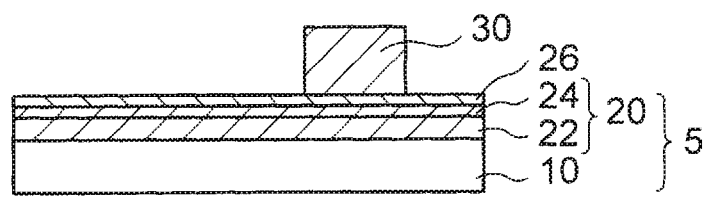
FIGS. 15A to 15C are sectional views depicting a manufacturing method of an electronic component built-in substrate according to a second exemplary embodiment (1).

In the manufacturing method of the electronic component built-in substrate of the second exemplary embodiment, the same processes as the processes of FIGS. 4A to 5A of the first exemplary embodiment are first performed. Thereby, as shown in FIG. 15A, a structure where the first wiring layer 30 is formed on the nickel layer 26 on the stacked substrate 5 is obtained, like FIG. 5A.

In this way, the first wiring layer 30 is formed on the base layer having the component mounting area. In the second exemplary embodiment, the first wiring layer 30 is arranged outside the component mounting area.

Figure 15B:
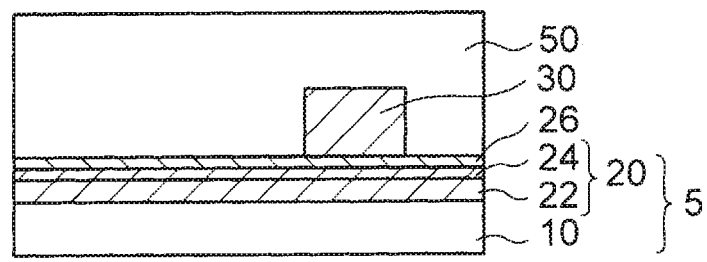
Figure 15C:
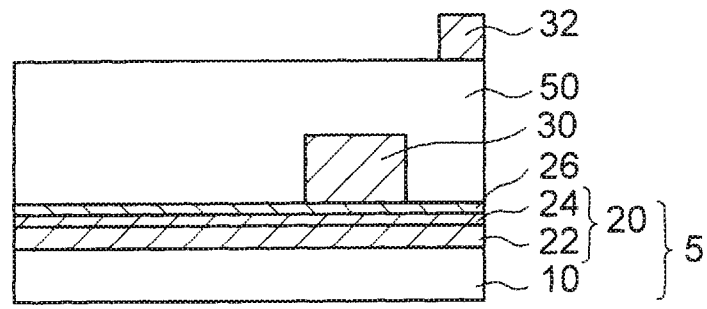

Subsequently, as shown in FIG. 15B, the first insulation layer 50 is formed on the nickel layer 26 and the first wiring layer 30 by the same method as the process of FIG. 5C. Also, as shown in FIG. 15C, the second wiring layer 32 is formed on the first insulation layer 50 outside the component mounting area. The second wiring layer 32 is formed by the semi-additive method, for example. Although not particularly shown, the second wiring layer 32 is connected to the first wiring layer 30 through a via conductor formed in the first insulation layer 50.

Figure 16A:
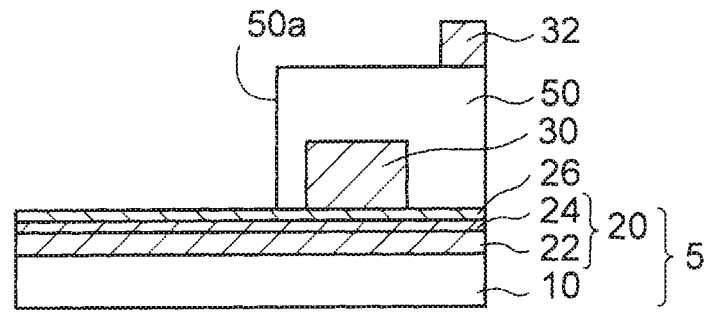
FIGS. 16A to 16C are sectional views depicting the manufacturing method of the electronic component built-in substrate according to the second exemplary embodiment (2).

Subsequently, as shown in FIG. 16A, an opening 50a passing through from the upper surface of the first insulation layer 50 to the lower surface thereof is formed by router processing, laser processing or the like. The opening 50a of the first insulation layer 50 is formed at a part corresponding to the component mounting area.

Figure 16B:
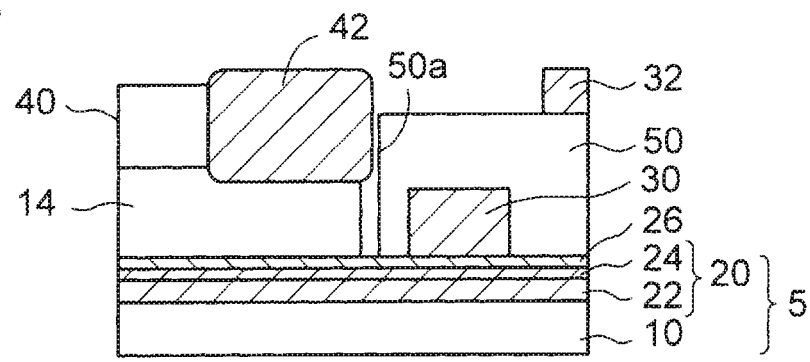

Subsequently, as shown in FIG. 16B, the capacitor element 40 is bonded on the nickel layer 26 in the opening 50a of the first insulation layer 50 by the adhesive resin layer 14.

In FIG. 16B, the right electrode 42 of the capacitor element 40 is partially shown, like the first exemplary embodiment.

A height position of the upper surface of the electrode 42 of the capacitor element 40 is set to be higher than a height position of the upper surface of the first insulation layer 50 and to be substantially the same as a height position of the upper surface of the second wiring layer 32.

Figure 16C:
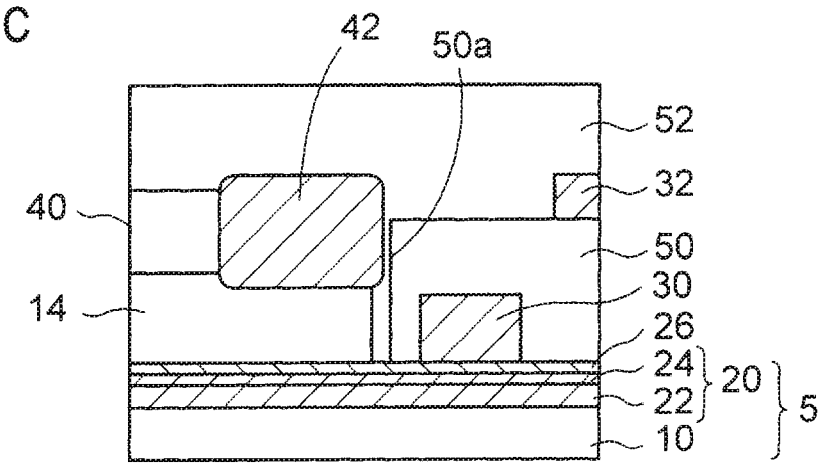

Further, as shown in FIG. 16C, the second insulation layer 52 for embedding therein the capacitor element 40 and the second wiring layer 32 is formed on the first insulation layer 50 by the same method as the formation method of the first insulation layer 50 shown in FIG. 5C. The second insulation layer 52 is filled in the opening 50a of the first insulation layer 50.

Subsequently, as shown in FIG. 17A, like the process of FIG. 6A of the first exemplary embodiment, the second insulation layer 52 is subjected to the laser processing, so that the first via hole VH1 reaching the upper surface of the electrode 42 of the capacitor element 40.

Also, as shown in FIG. 17B, the second via hole VH2 reaching the side surface of the electrode 42 of the capacitor element 40 and the upper surface of the first wiring layer 30 is formed by the same method as the laser processing of FIGS. 6B to 7B of the first exemplary embodiment. The second via hole VH2 is formed by the first, second and third holes H1, H2, H3, like the first exemplary embodiment.

Then, as shown in FIG. 18A, the third wiring layer 34 is formed in the first via hole VH1, in the second via hole VH2 and on the second insulation layer 52 by the same method as the process of FIG. 8A of the first exemplary embodiment.

Like the first exemplary embodiment, the third wiring layer 34 has a first wiring part 34a connected to the upper surface of the electrode 42 of the capacitor element 40 through the first via conductor VC1, in the first via hole VH1. Likewise, the third wiring layer 34 has a second wiring part 34b connected to the side surface of the electrode 42 of the capacitor element 40 and to the upper surface of the first wiring layer 30 through the second via conductor VC2 in the second via hole VH2.

Subsequently, as shown in FIG. 18B, the stacked substrate 5 and the nickel layer 26 are removed to expose the lower surface of the first wiring layer 30 by performing the same processes as the processes of FIGS. 9B to 10B of the first exemplary embodiment.

Thereafter, as shown in FIG. 19, the first solder resist layer 46 having the opening 46a arranged on the pad P1 of the first wiring layer 30 is formed below the first insulation layer 50, like the process of FIG. 11 of the first exemplary embodiment.

Also, the second solder resist layer 48 having the opening 48a arranged on the pad P2 of the second wiring part 34b of the third wiring layer 34 is formed on the second insulation layer 52.

By the above processes, an electronic component built-in substrate 1a of the second exemplary embodiment is obtained. FIG. 20 depicts an entire shape of the capacitor element 40 shown in FIG. 19.

As shown in FIG. 20, according to the electronic component built-in substrate 1a of the second exemplary embodiment, the capacitor element 40 is entirely embedded in the insulating base material 6, like the electronic component built-in substrate 1 of the first exemplary embodiment. The capacitor element 40 has a pair of electrode 42, 44 on both side surfaces.

The insulating base material 6 has the first surface S1, which is the lower surface, and the second surface S2, which is the upper surface opposite to the first surface. In the second exemplary embodiment, the insulating base material 6 is formed by the adhesive resin layer 14 arranged below the capacitor element 40, the first insulation layer 50 arranged outside the adhesive resin layer 14 and the capacitor element 40, and the second insulation layer 52 for embedding therein the capacitor element 40.

The capacitor element 40 is bonded in the opening 50a of the first insulation layer 50 by the adhesive resin layer 14. The second insulation layer 52 is provided on the first insulation layer 50, and embeds therein the capacitor element 40 in the opening 50a of the first insulation layer 50.

In the second exemplary embodiment, the first surface S1 of the insulating base material 6 is the respective lower surfaces of the adhesive resin layer 14, the first insulation layer 50 and the second insulation layer 52. Also, the second surface S2 of the insulating base material 6 is the upper surface of the second insulation layer 52.

Also, the first wiring layer 30 is embedded in an area outside the electrodes 42, 44 of the capacitor element 40 in the first insulation layer 50 with a surface thereof being exposed from the first surface S1. The lower surface of the first wiring layer 30 is exposed from the first surface S1 of the first insulation layer 50, and the upper surface and side surfaces of the first wiring layer 30 are embedded in the first insulation layer 50.

The lower surface of the adhesive resin layer 14 below the capacitor element 40, the lower surface of the first wiring layer 30, the lower surface of the first insulation layer 50 and the lower surface of the second insulation layer 52 are arranged at the same height, so that the respective lower surfaces are flush with each other.

The first solder resist layer 46 having the opening 46a arranged on the pad P1 of the first wiring layer 30 is formed on the lower surfaces of the adhesive resin layer 14, the first insulation layer 50 and the second insulation layer 52.

Also, the second wiring layer 32 is formed between the first insulation layer 50 and the second insulation layer 52. The second insulation layer 52 is formed with the first via holes VH1 reaching the upper surfaces of the electrodes 42, 44 of the capacitor element 40.

Also, the second insulation layer 52 and the first insulation layer 50 are formed with the second via holes VH2 reaching the side surfaces of the electrodes 42, 44 of the capacitor element 40 and the upper surface of the first wiring layer 30.

The third wiring layer 34 is formed to protrude from the second surface S2 of the second insulation layer 52. The third wiring layer 34 has the first wiring parts 34a connected to the upper surfaces of the electrodes 42, 44 of the capacitor element 40 through the first via conductors VC1 in the first via holes VH1.

Also, the third wiring layer 34 has the second wiring parts 34b connected to the side surfaces of the electrodes 42, 44 of the capacitor element 40 and to the upper surface of the first wiring layer 30 through the second via conductors VC2 in the second via holes VH2.

Further, the second solder resist layer 48 having the opening 48a arranged on the pad P2 of the third wiring layer 34 is formed on the second insulation layer 52.

In the second exemplary embodiment, the capacitor element 40 is mounted in the opening 50a of the first insulation layer 50 via the adhesive resin layer 14, and the capacitor element 40 is embedded by the second insulation layer 52. Further, the second wiring layer 32 is arranged between the first insulation layer 50 and the second insulation layer 52.

In the electronic component built-in substrate 1 of the first exemplary embodiment, the capacitor element 40 is embedded only in the first insulation layer 50. In contrast, according to the electronic component built-in substrate 1a of the second exemplary embodiment, the capacitor element 40 is embedded in both the first insulation layer 50 and the second insulation layer 52. For this reason, the first insulation layer 50 can be made thinner in the second exemplary embodiment.

Herein, a thickness of the second insulation layer 52 is net to be substantially the same in the first exemplary embodiment and the second exemplary embodiment so as to secure insulation and electric characteristics between the second wiring layer 32 and the third wiring layer 34 provided above and below the second insulation layer 52.

Therefore, when forming a multi-layered wiring layer having the same number of layers (three layers), the electronic component built-in substrate 1a of the second exemplary embodiment can be made thinner than the electronic component built-in substrate 1 of the first exemplary embodiment.

In the electronic component built-in substrate 1a of the second exemplary embodiment, the pad P1 of the first wiring layer 30 of the lower surface-side is connected to the side surface of the right electrode 42 of the capacitor element 40 through the second via conductor VC2. This wiring path is the first power supply line PL1.

Also, the pad P2 of the third wiring layer 34 of the upper surface-side of the electronic component built-in substrate 1a is connected to the side surface of the right electrode 42 of the capacitor element 40 through the second via conductor VC2. This wiring path is the second power supply line PL2.

Further, the pad P1x of the first wiring layer 30 of the lower surface-side of the electronic component built-in substrate 1a is connected to the side surface of the left electrode 44 of the capacitor element 40 through the second via conductor VC2. This wiring path is the first ground line GL1.

Also, the pad P2x of the third wiring layer 34 of the upper surface-side of the electronic component built-in substrate 1a is connected to the side surface of the left electrode 44 of the capacitor element 40 through the second via conductor VC2. This wiring path is the second ground line GL2.

In this way, also in the second exemplary embodiment, the right electrode 42 of the capacitor element 40 is connected to the first power supply line PL1 of the lower side and the second power supply line PL2 of the upper surface-side.

Likewise, the left electrode 44 of the capacitor element 40 is connected to the first ground line GL1 of the lower side and the second ground line GL2 of the upper surface-side.

The electronic component built-in substrate 1a of the second exemplary embodiment accomplishes the same effects as the electronic component built-in substrate 1 of the first exemplary embodiment. Also, as described above, the electronic component built-in substrate 1a of the second exemplary embodiment can be made thinner than the first exemplary embodiment.

FIG. 21 depicts an electronic device 2a of the second exemplary embodiment. As shown in FIG. 21, the electronic component built-in substrate 1a of FIG. 20 is inverted up and down, like the electronic device 2 of the first exemplary embodiment shown in FIG. 13. Then, the terminals 62 of the semiconductor chip 60 are flip chip-connected to the pads P1, P1x of the first wiring layer 30 via the solderings 64.

Then, the underfill resin 66 is filled below the semiconductor chip 60. Further, the external connection terminals T are formed on the pads P2, P2x of the third wiring layer 34 of the lower surface-side. By the above processes, an electronic device 2a of the second exemplary embodiment is obtained.

In the above aspect, as shown in FIGS. 20 and 21, noting the third wiring layer 34 connected to the right electrode 42 of the capacitor element 40, the pad P2 of the second wiring part 34b of the third wiring layer 34 is used as a connection part of the external connection terminal T.

The first wiring part 34a of the third wiring layer 34 has a preliminary pad and is connected to the electrode 42 of the capacitor element 40, like the second wiring part 34b. For this reason, the opening 48a of the second solder resist layer 48 may be provided on the preliminary pad of the first wiring part 34a of the third wiring layer 34 and may be used as a connection part, depending on a layout of the external connection terminals T.

In this case, the pad P2 of the second wiring part 34b of the third wiring layer 34 is covered with the second solder resist layer 48. Also in the third wiring layer 34 connected to the left electrode 44 of the capacitor element 40, a layout can be changed.

By adopting the above structure, it is possible to improve a degree of wiring layout freedom of the electronic component built-in substrate.

Alternatively, in contrast, the terminals of the semiconductor chip may be flip chip-connected to the pads P2, P2x of the second wiring parts 34b of the third wiring layer 34, and the external connection terminals may be provided on the pads P1, P1x of the first wiring layer 30.

Also in the first exemplary embodiment of FIGS. 12 and 13, pads of the third wiring layer 34 connected to the first wiring parts 32a of the second wiring layer 32 may be formed and a wiring layout may be changed.

Figure 22:
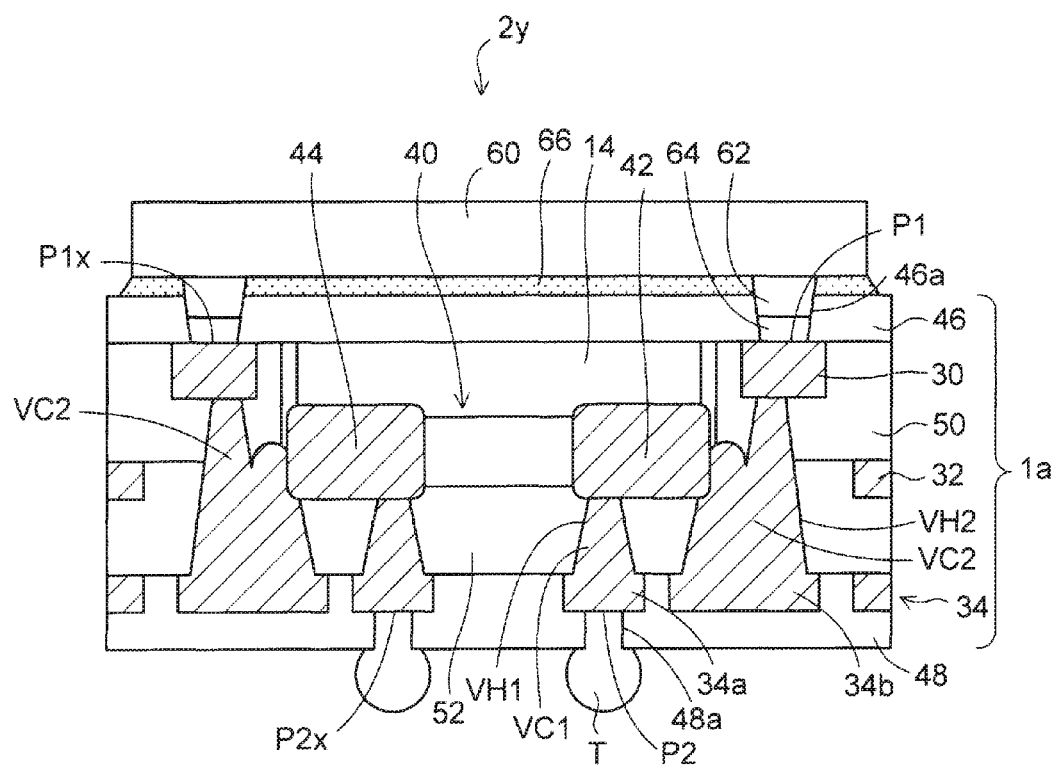
FIG. 22 is a sectional view depicting an electronic device according to a modified example of the second exemplary embodiment.

FIG. 22 depicts an electronic device 2y according to a modified example of the second exemplary embodiment. Like the electronic device 2y of FIG. 22, the openings 48a of the second solder resist layer 48 may be provided on the preliminary pads of the first wiring parts 34a of the third wiring layer 34, which may be used as the pads P2, P2x, as described above. The external connection terminals T are provided on the pads P2, P2x of the first wiring parts 34a of the third wiring layer 34.

Third Exemplary Embodiment

Figure 23:
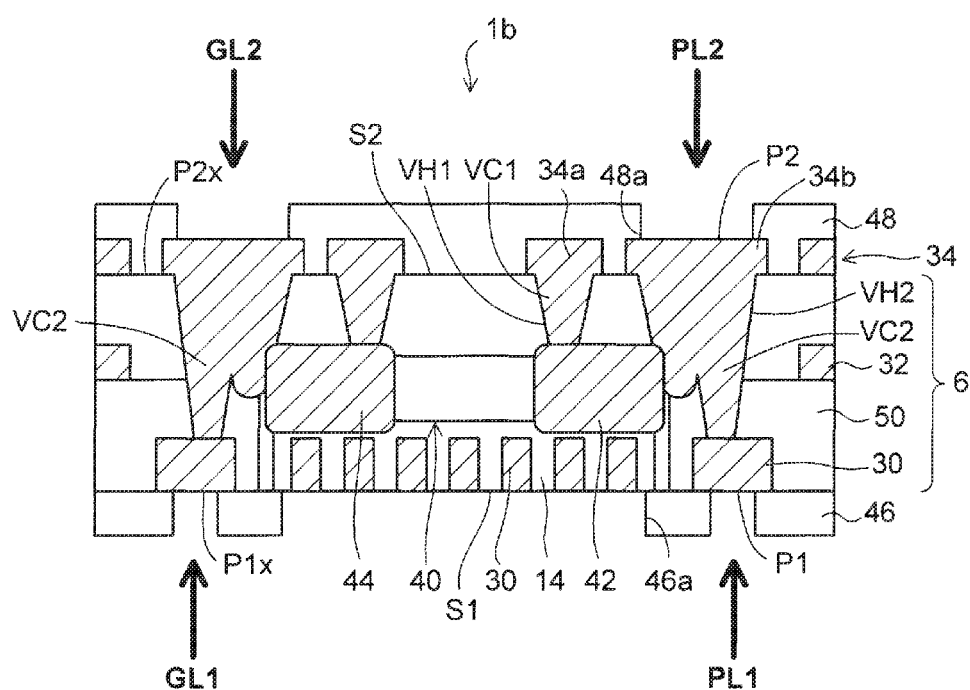
FIG. 23 is a sectional view depicting an electronic component built-in substrate according to a third exemplary embodiment.

FIG. 23 depicts an electronic component built-in substrate of a third exemplary embodiment. As shown in FIG. 23, according to the electronic component built-in substrate 1b of the third exemplary embodiment, the first wiring layer 30 is further arranged in a lower area of the capacitor element 40 of the electronic component built-in substrate 1a according to the second exemplary embodiment shown in FIG. 20.

The first wiring layer 30 arranged below the capacitor element 40 is embedded with being insulated from the electrode 42 of the capacitor element 40 in the adhesive resin layer 14. The upper surface and side surfaces of the first wiring layer 30 are embedded in the adhesive resin layer 14 with the lower surface of the first wiring layer 30 being exposed from the first surface S1 of the adhesive resin layer 14.

The solder resist layer 46 is formed with an opening 46a for exposing the entire first wiring layer 30 provided in the lower area of the capacitor element 40.

In this way, according to the electronic component built-in substrate 1b of the third exemplary embodiment, the first wiring layer 30 is arranged in the lower area of the capacitor element 40, too. For this reason, it is possible to arrange the pads of the first wiring layer 30 in an area array form in the higher density than the electronic component built-in substrate 1a of the second exemplary embodiment shown in FIG. 20. Thereby, it is possible to use the electronic component built-in substrate 1b as a wiring substrate of a high-performance semiconductor chip.

In order to manufacture the electronic component built-in substrate of the third exemplary embodiment, the first wiring layer 30 is preferably arranged in the component mounting area, too, in which the capacitor element 40 is to be arranged, in the process of FIG. 15A of the second exemplary embodiment. In the process of FIG. 16B of the second exemplary embodiment, the capacitor element 40 is arranged on the first wiring layer 30 of the component mounting area via the adhesive resin layer 14. The other manufacturing processes are the same as the second exemplary embodiment.

Figure 24:
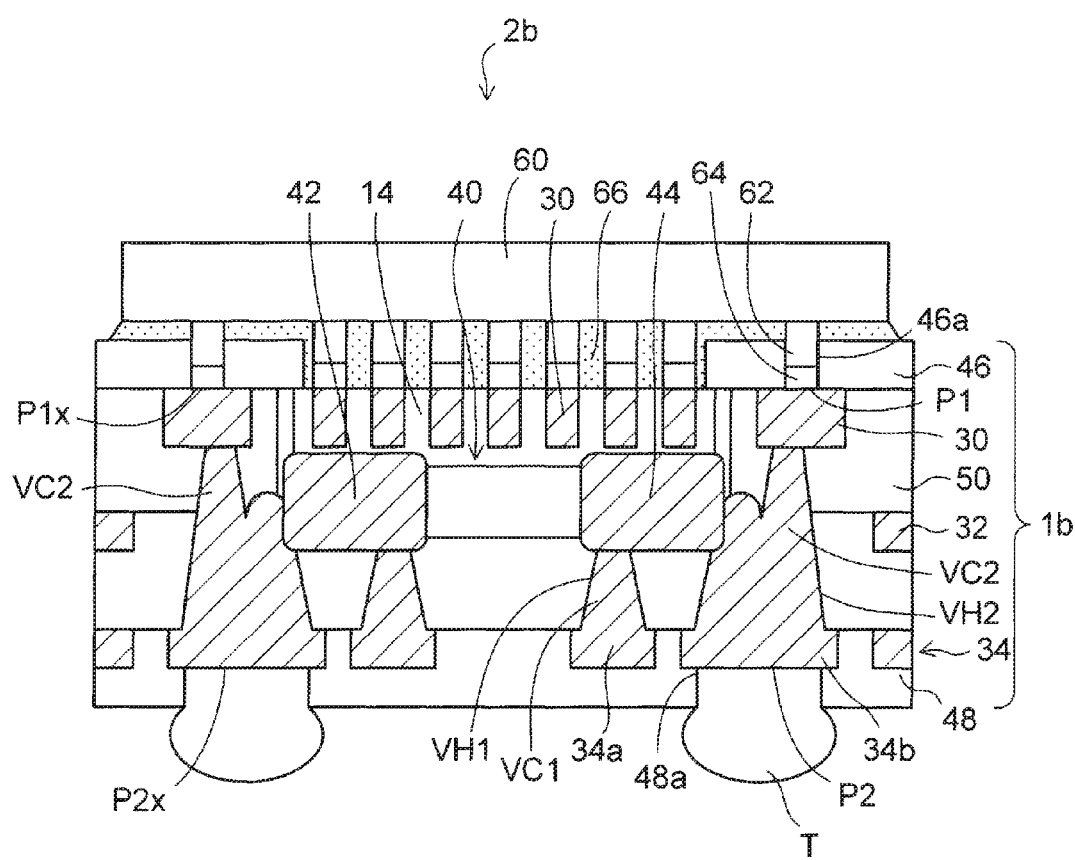
FIG. 24 is a sectional view depicting an electronic device according to the third exemplary embodiment.

FIG. 24 depicts an electronic device 2b of the third exemplary embodiment. As shown in FIG. 24, the electronic component built-in substrate 1b of FIG. 23 is inverted up and down, like the electronic device 2 of the first exemplary embodiment shown in FIG. 13. Then, the terminals 62 of the semiconductor chip 60 are flip chip-connected to the pads arranged in an area array form including the pads P1, P1x of the first wiring layer 30 via the solderings 64.

Thereafter, the underfill resin 66 is filled below the semiconductor chip 60. Further, the external connection terminals T are formed on the pads P2, P2x of the third wiring layer 34 of the lower surface-side. By the above processes, an electronic device 2b of the third exemplary embodiment is obtained.

Fourth Exemplary Embodiment

Figure 27A:
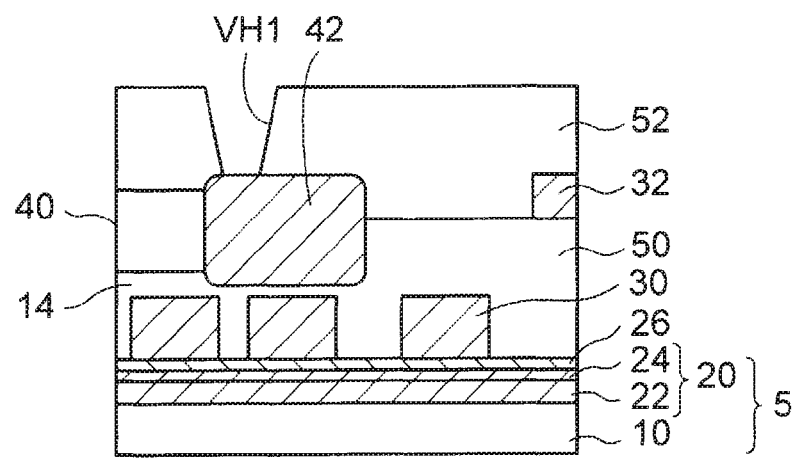
FIGS. 27A and 27B are sectional views depicting the manufacturing method of the electronic component built-in substrate according to the fourth exemplary embodiment (3).
Figure 27B:
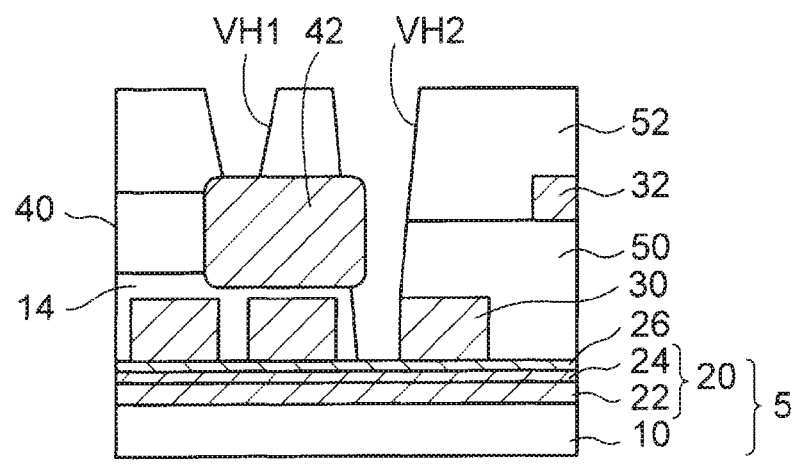
Figure 28A:
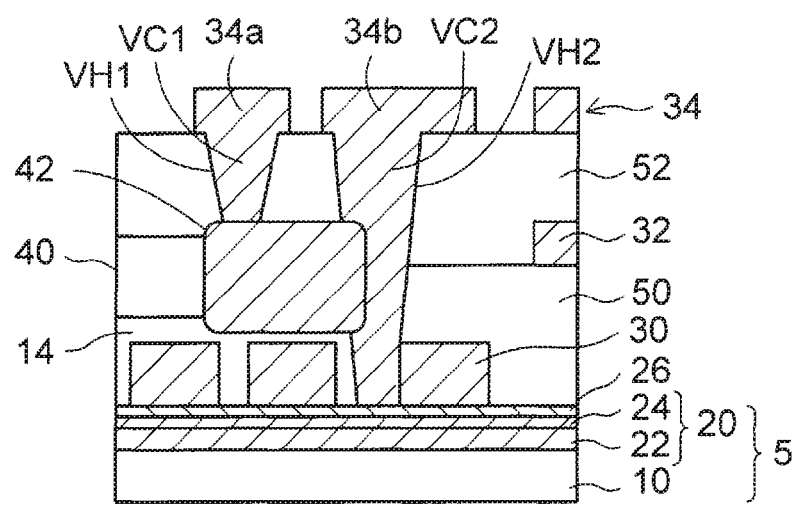
FIGS. 28A and 28B are sectional views depicting the manufacturing method of the electronic component built-in substrate according to the fourth exemplary embodiment (4).
Figure 28B:
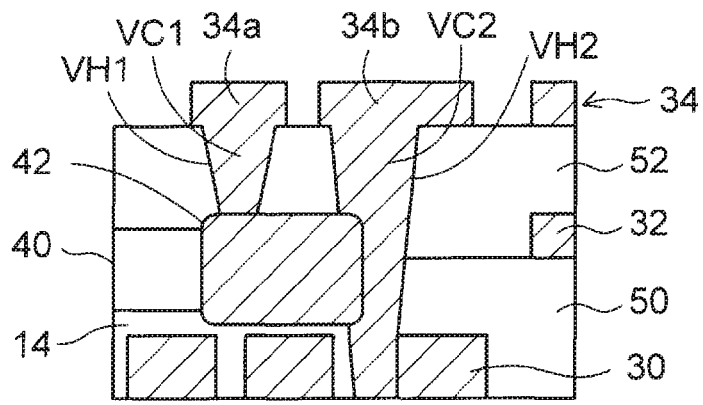
Figure 29:
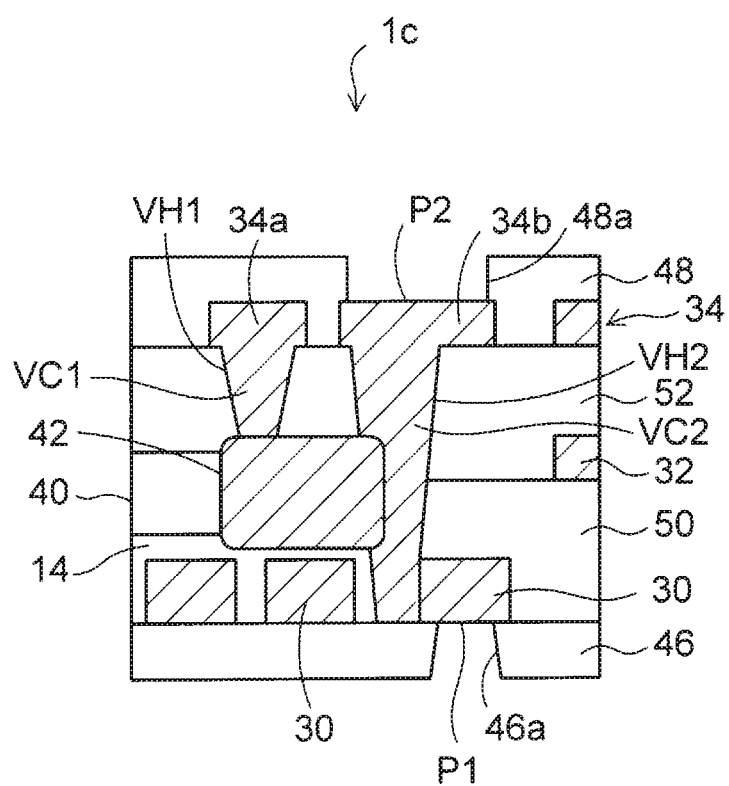
FIG. 29 is a sectional view depicting the electronic component built-in substrate according to the fourth exemplary embodiment (1).
Figure 30:
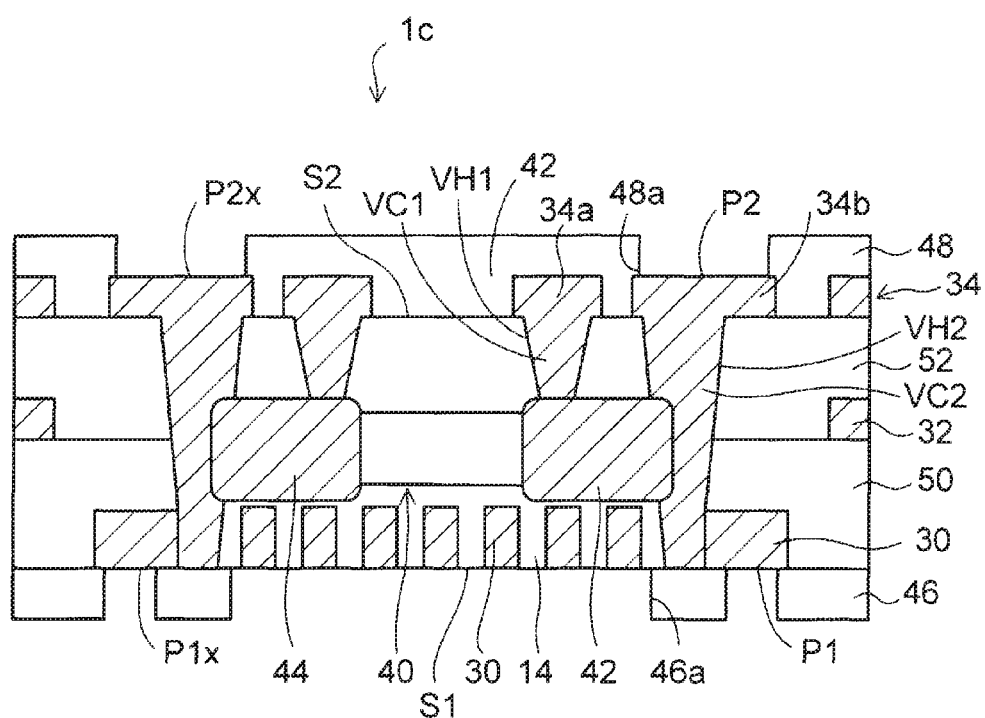
FIG. 30 is a sectional view depicting the electronic component built-in substrate according to the fourth exemplary embodiment (2).

FIGS. 25A to 28B depict a manufacturing method of an electronic component built-in substrate of a fourth exemplary embodiment, and FIGS. 29 and 30 depict the electronic component built-in substrate of the fourth exemplary embodiment.

In the fourth exemplary embodiment, the second via hole VH2 reaching the electrode 42 of the capacitor element 40 and the first wiring layer 30 is formed by one-time laser processing, in the manufacturing method of the second exemplary embodiment.

Figure 25A:
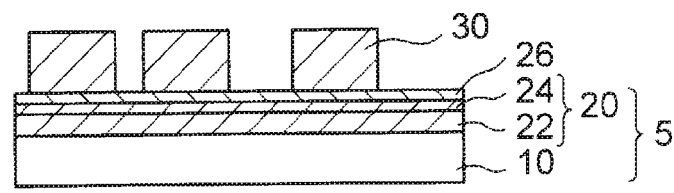
FIGS. 25A to 25C are sectional views depicting a manufacturing method of an electronic component built-in substrate according to a fourth exemplary embodiment (1).

In the manufacturing method of the electronic component built-in substrate of the fourth exemplary embodiment, as shown in FIG. 25A, the same processes as the processes of FIGS. 4A to 5A of the first exemplary embodiment are first performed, so that the first wiring layer 30 is formed on the nickel layer 26 on the stacked substrate 5.

In the fourth exemplary embodiment, the first wiring layer 30 is arranged in the component mounting area, too, in which the capacitor element is to be arranged, like the third exemplary embodiment.

Figure 25B:
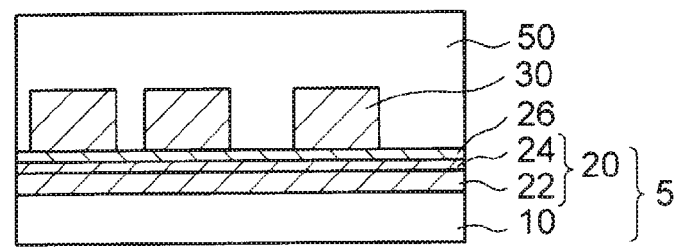

Subsequently, as shown in FIG. 25B, the first insulation layer 50 is formed on the nickel layer 26 and the first wiring layer 30 by the same method as the process of FIG. 5C, of the first exemplary embodiment.

Figure 25C:
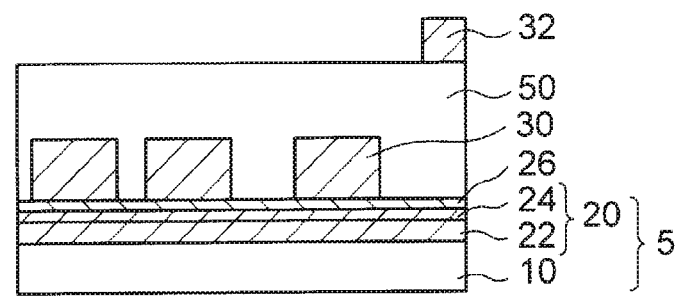

Further, as shown in FIG. 25C, the second wiring layer 32 is formed on the first insulation layer 50. Like the second exemplary embodiment, the second wiring layer 32 is connected to the first wiring layer 30 through the via conductor formed in the first insulation layer 50, although not shown.

Figure 26A:
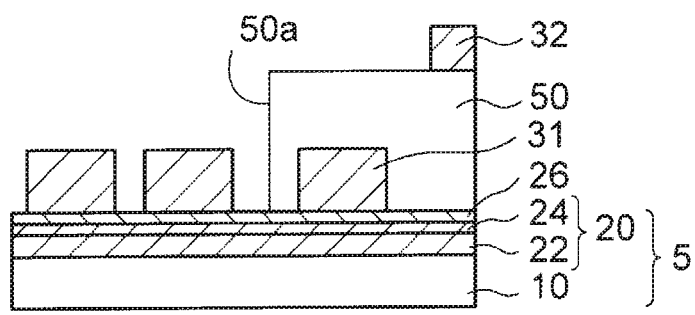
FIGS. 26A to 26C are sectional views depicting the manufacturing method of the electronic component built-in substrate according to the fourth exemplary embodiment (2).

Subsequently, as shown in FIG. 26A, the opening 50a is formed in the first insulation layer 50 at a part corresponding to the component mounting area. Thereby, the first wiring layer 30 is exposed to the component mounting area.

Figure 26B:
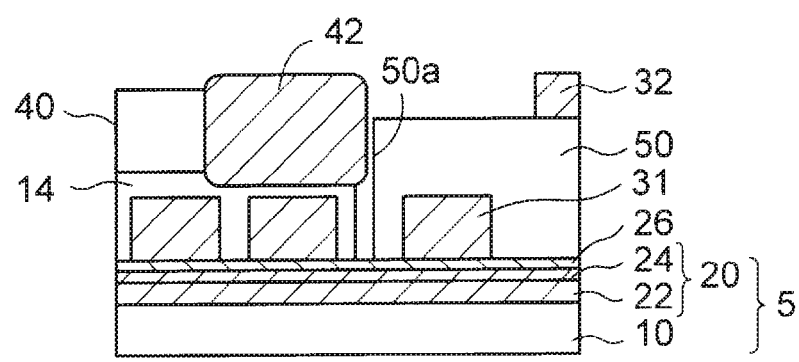

Then, as shown in FIG. 26B, the capacitor element 40 is bonded on the nickel layer 26 and the first wiring layer 30 in the component mounting area via the adhesive resin layer 14.

Figure 26C:
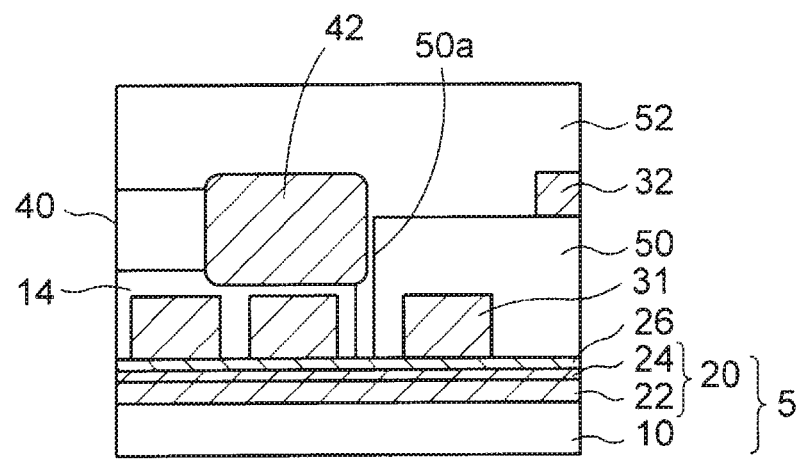

Then, as shown in FIG. 26C, the second insulation layer 52 for embedding the capacitor element 40 and the second wiring layer 32 is formed on the first insulation layer 50.

Subsequently, as shown in FIG. 27A, the second insulation layer 52 is subjected to the laser processing, so that the first via hole VH1 reaching the upper surface of the electrode 42 of the capacitor element 40 is formed. Further, as shown in FIG. 27B, the second insulation layer 52 and the first insulation layer 50 are subjected to the laser processing, so that the second via hole VH2 reaching the side surface of the electrode 42 of the capacitor element 40 and the side surface of the first wiring layer 30 is formed at one time.

In FIGS. 6B to 7B of the first exemplary embodiment, the second via hole VH2 reaching the side surface of the capacitor element 40 and the upper surface of the first wiring layer 30 is formed by the three-times laser processing.

In the fourth exemplary embodiment, a beam diameter of laser light is set to be greater and an output of the laser light is also set to be higher, so that the second via hole VH2 reaching the side surface of the capacitor element 40 and the side surface of the first wiring layer 30 is formed by the one-time laser processing.

In the example of FIG. 27B, the second via hole VH2 reaches the side surface of the first wiring layer 30 but may be formed to reach from the side surface of the first wiring layer 30 to a part of the upper surface.

Subsequently, as shown in FIG. 28A, the third wiring layer 34 is formed on the second insulation layer 52 by the same method as the process of FIG. 8A of the first exemplary embodiment.

Like FIG. 18A of the second exemplary embodiment, the third wiring layer 34 has the first wiring parts 34a connected to the upper surfaces of the electrodes 42, 44 of the capacitor element 40 through the first via conductors VC1 in the first via holes VH1.

Also, the third wiring layer 34 has the second wiring parts 34b connected to the side surfaces of the electrodes 42, 44 of the capacitor element 40 and to the side surface of the first wiring layer 30 through the second via conductors VC2 in the second via holes VH2.

Subsequently, as shown in FIG. 28B, the same processes as the processes of FIGS. 9A to 10B of the first exemplary embodiment are performed to remove the stacked substrate 5 and the nickel layer 26, thereby exposing the lower surface of the first wiring layer 30.

Then, as shown in FIG. 29, the first solder resist layer 46 having the opening 46a arranged on the pad P1 of the first wiring layer 30 is formed below the first insulation layer 50, like FIG. 19 of the second exemplary embodiment.

Further, the second solder resist layer 48 having the opening 48a arranged on the pad P2 of the second wiring part 34b of the third wiring layer 34 is formed on the second insulation layer 52.

By the above processes, an electronic component built-in substrate 1c of the fourth exemplary embodiment is manufactured. FIG. 30 depicts an entire shape of the capacitor element 40 of FIG. 29.

The electronic component built-in substrate 1c of the fourth exemplary embodiment shown in FIG. 30 is different from the electronic component built-in substrate 1a of the second exemplary embodiment, as follows. A first difference is that the first wiring layer 30 is arranged in the lower area of the capacitor element 40, too, like the electronic component built-in substrate 1b of the third exemplary embodiment.

A second difference is that the second via holes VH2 reaching the side surfaces of the electrodes 42, 44 of the capacitor element 40 and the first wiring layer 30 are formed in the second insulation layer 52 and the first insulation layer 50 by one-time laser processing.

Therefore, the second via hole VH2 and the second via conductor VC2 formed in the electronic component built-in substrate 1c of the fourth exemplary embodiment have one circular shape, as seen from a plan view. Further, the second via conductor VC2 have a shape, whose area as seen from the plan view decreases with the increasing distance from the surface of the second insulation layer 52.

Since the other elements are the same as the electronic component built-in substrate 1b of the third exemplary embodiment shown in FIG. 23, the detailed descriptions thereof are omitted.

According to the electronic component built-in substrate 1c of the fourth exemplary embodiment, the first wiring layer 30 is further arranged below the capacitor element 40, too, like the third exemplary embodiment. Therefore, it is possible to establish a multi-layered wiring having high wiring density.

Also, the second via holes VH2 reaching the side surfaces of the electrodes 42, 44 of the capacitor element 40 and the first wiring layer 30 are formed by one-time laser processing, it is possible to implement a short lead time, thereby saving the manufacturing cost.

CLAUSES

This disclosure further encompasses various exemplary embodiments, for example, described below 1. A manufacturing method of an electronic component built-in substrate, the method comprising:

forming a first wiring layer outside a component mounting area on a base layer;

bonding an electronic component to the component mounting area on the base layer via an adhesive resin layer, the electronic component having an electrode on a side surface thereof;

forming an insulation layer so as to embed therein the electronic component and the first wiring layer;

forming a via hole in the insulation layer, the via hole reaching a side surface of the electrode of the electronic component and the first wiring layer;

forming a second wiring layer on the insulation layer through a via conductor formed in the via hole, the second wiring layer being connected to the side surface of the electrode of the electronic component and to the first wiring layer; and removing the base layer.

2. A manufacturing method of an electronic component built-in substrate, the method comprising:

forming a first wiring layer on a base layer having a component mounting area;

forming a first insulation layer on the base layer and the first wiring layer;

forming a second wiring layer on the first insulation layer outside the component mounting area;

forming an opening in the first insulation layer at a part corresponding to the component mounting area;

bonding an electronic component to the opening of the first insulation layer via an adhesive resin layer, the electronic component having an electrode on a side surface thereof;

forming a second insulation layer on the electronic component, the first insulation layer and the second wiring layer;

forming a via hole in the second insulation layer and the first insulation layer, the via hole reaching a side surface of the electrode of the electronic component and the first wiring layer;

forming a third wiring layer on the second insulation layer through a via conductor formed in the via hole, the third wiring layer being connected to the side surface of the electrode of the electronic component and to the first wiring layer; and removing the base layer.

3. The manufacturing method according to claim 1 or 2, wherein forming the via hole comprises:

forming a first hole reaching the side surface of the electrode of the electronic component by first-time laser processing, forming a second hole communicating with the first hole by second-time laser processing, and forming a third hole communicating with a bottom of the second hole and reaching the first wiring layer by third-time laser processing.

What is claimed is:

1. An electronic component built-in substrate comprising:
   an insulating base material having a first surface and a second surface opposite to the first surface;
   an electronic component embedded in the insulating base material and having an electrode on a lateral side surface thereof;
   a first wiring layer embedded in an area laterally outside the electrode of the electronic component in the insulating base material with a surface of the first wiring layer being exposed from the first surface of the insulating base material;
   a via conductor reaching from the second surface of the insulating base material to a lateral side surface of the electrode of the electronic component and the first wiring layer, the via conductor being disposed at the second surface of the insulating base material and directly contacting the lateral side surface of the electrode of the electronic component and the first wiring layer; and
   a second wiring layer formed on the second surface of the insulating base material and connected to the via conductor.

2. The electronic component built-in substrate according to claim 1, wherein the insulating base material includes
   an adhesive resin layer arranged on a first surface of the electronic component, and
   an insulation layer in which the electronic component and the first wiring layer are embedded.

3. The electronic component built-in substrate according to claim 1, wherein the insulating base material includes
   an adhesive resin layer arranged on a first surface of the electronic component,
   a first insulation layer arranged laterally outside the adhesive resin layer and the electronic component and having an opening formed in an area in which the electronic component is mounted, and
   a second insulation layer in which the electronic component in the opening is embedded, the second insulation layer being provided on the first insulation layer, and wherein the electronic component built-in substrate further comprises:
   a third wiring layer formed between the first insulation layer and the second insulation layer.

4. The electronic component built-in substrate according to claim 2, wherein respective first surfaces of the adhesive resin layer, the insulation layer and the first wiring layer are entirely flush with each other.

5. The electronic component built-in substrate according to claim 3, wherein respective first surfaces of the adhesive resin layer, the first insulation layer and the first wiring layer are entirely flush with each other.

6. The electronic component built-in substrate according to claim 3, wherein the first wiring layer is embedded in the adhesive resin layer arranged on the first surface of the electronic component and is exposed from a first surface of the adhesive resin layer.

7. The electronic component built-in substrate according to claim 1, wherein the via conductor has a gourd shape having two circles which communicate with each other when viewed in a planar direction from the second surface of the insulating base material.

8. The electronic component built-in substrate according to claim 1, wherein the via conductor has a shape such that an area thereof as seen from the second surface of the insulating base material decreases as a distance from the second surface of the insulating base material increases.

9. The electronic component built-in substrate according to claim 1, wherein
   a width of the via conductor decreases from the second surface of the insulating base material toward the first wiring layer,
   the electrode of the electronic component has an upper surface, the lateral side surface, and a lower surface, and
   the via conductor is directly connected to the electrode of the electronic component in a state that the via conductor is continuously connected to the electrode of the electronic component from the upper surface to the lower surface via the side surface.

10. An electronic device comprising:
    an insulating base material having a first surface and a second surface opposite to the first surface;
    an electronic component embedded in the insulating base material and having an electrode on a lateral side surface thereof;
    a first wiring layer embedded in an area laterally outside the electrode of the electronic component in the insulating base material with a surface of the first wiring layer being exposed from the first surface of the insulating base material;
    a via conductor reaching from the second surface of the insulating base material to a lateral side surface of the electrode of the electronic component and the first wiring layer, the via conductor being disposed at the second surface of the insulating base material and directly contacting the lateral side surface of the electrode of the electronic component and the first wiring layer;
    a second wiring layer formed on the second surface of the insulating base material and connected to the via conductor; and
    a semiconductor chip connected to the first wiring layer.

11. The electronic component built-in substrate according to claim 1, wherein
    the via conductor includes a first via conductor portion and a second via conductor portion, the first via conductor portion and the second via conductor portion form a gourd shape having two circles which communicate with each other when viewed in a planar direction from the second surface of the insulating base material, the first via conductor portion reaches the lateral side surface of the electrode of the electronic component from the second surface of the insulating base material and is directly connected to the lateral side surface of the electrode, the second via conductor portion reaches the first wiring layer from the second surface of the insulating base material and is directly connected to the first wiring layer, and a height of the second via conductor portion is greater than a height of the first via conductor portion.

12. The electronic device according to claim 10, wherein the via conductor includes a first via conductor portion and a second via conductor portion, the first via conductor portion and the second via conductor portion form a gourd shape having two circles which communicate with each other when viewed in a planar direction from the second surface of the insulating base material, the first via conductor portion reaches the lateral side surface of the electrode of the electronic component from the second surface of the insulating base material and is directly connected to the lateral side surface of the electrode, the second via conductor portion reaches the first wiring layer from the second surface of the insulating base material and is directly connected to the first wiring layer, and a height of the second via conductor portion is greater than a height of the first via conductor portion.

13. The electronic device according to claim 10, wherein a width of the via conductor decreases from the second surface of the insulating base material toward the first wiring layer, the electrode of the electronic component has an upper surface, the lateral side surface, and a lower surface, and the via conductor is directly connected to the electrode of the electronic component in a state that the via conductor is continuously connected to the electrode of the electronic component from the upper surface to the lower surface via the side surface.

* * * * *